(12) United States Patent
Suzuki et al.

(10) Patent No.: US 10,739,686 B2
(45) Date of Patent: Aug. 11, 2020

(54) BEAM TRANSMISSION SYSTEM, EXPOSURE DEVICE, AND ILLUMINATION OPTICAL SYSTEM OF THE EXPOSURE DEVICE

(71) Applicant: Gigaphoton Inc., Tochigi (JP)

(72) Inventors: Akiyoshi Suzuki, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/028,240

(22) Filed: Jul. 5, 2018

(65) Prior Publication Data
US 2018/0314156 A1 Nov. 1, 2018

Related U.S. Application Data

(63) Continuation of application No. PCT/JP2016/055921, filed on Feb. 26, 2016.

(51) Int. Cl.
*G03F 7/20* (2006.01)
*H05H 13/04* (2006.01)
*H01S 3/09* (2006.01)

(52) U.S. Cl.
CPC ........... *G03F 7/70566* (2013.01); *G03F 7/20* (2013.01); *G03F 7/70025* (2013.01); *G03F 7/70075* (2013.01); *G03F 7/70116* (2013.01); *G03F 7/70716* (2013.01); *H01S 3/0903* (2013.01); *H05H 13/04* (2013.01)

(58) Field of Classification Search
CPC .... G03F 7/20; G03F 7/70025; G03F 7/70075; G03F 7/70116; G03F 7/70566; G03F 7/70716
See application file for complete search history.

(56) References Cited

U.S. PATENT DOCUMENTS 5,268,742 A * 12/1993 Magner ................. G01B 11/24
356/124
2003/0081210 A1 5/2003 Masaki et al.
(Continued)

FOREIGN PATENT DOCUMENTS

JP 04-120717 A 4/1992
JP 05-114548 A 5/1993
(Continued)

OTHER PUBLICATIONS

International Search Report issued in PCT/JP2016/055921; dated May 24, 2016.
(Continued)

*Primary Examiner* — Michelle M Iacoletti
(74) *Attorney, Agent, or Firm* — Studebaker & Brackett PC

(57) ABSTRACT

The present invention allows more freely setting of the polarization direction of illumination light on an illumination surface of an exposure device. A beam transmission system (121) that transmits, to an exposure device (130), a linearly polarized optical beam (L) output from a free electron laser device (10) includes: an optical beam splitting unit (50) configured to split the optical beam (L) into a first optical beam (L1) and a second optical beam (L2); and a first polarization direction rotating unit (51) configured to rotate the linear polarization direction of the first optical beam (L1).

14 Claims, 17 Drawing Sheets

(56) References Cited

U.S. PATENT DOCUMENTS

| | | | |
|---|---|---|---|
| 2004/0090763 A1* | 5/2004 | Li | G02B 27/286 362/19 |
| 2005/0134825 A1* | 6/2005 | Schuster | G02B 27/283 355/71 |
| 2006/0146384 A1 | 7/2006 | Schultz et al. | |
| 2009/0070083 A1* | 3/2009 | Zhang | G03F 1/36 703/4 |
| 2009/0109417 A1* | 4/2009 | Tanitsu | G02B 27/0927 355/67 |
| 2009/0213356 A1 | 8/2009 | Gruner et al. | |
| 2010/0302522 A1 | 12/2010 | Venkataraman et al. | |
| 2012/0170013 A1 | 7/2012 | Tsuji | |
| 2012/0249989 A1 | 10/2012 | Fujii | |
| 2012/0281816 A1 | 11/2012 | Kuroda et al. | |
| 2014/0084183 A1 | 3/2014 | Wakabayashi et al. | |
| 2014/0132942 A1* | 5/2014 | Saenger | G03F 7/70108 355/71 |
| 2014/0368803 A1 | 12/2014 | Patra et al. | |
| 2015/0055110 A1 | 2/2015 | Maul | |
| 2015/0085272 A1 | 3/2015 | Saenger et al. | |
| 2015/0124233 A1 | 5/2015 | Patra | |
| 2015/0173163 A1 | 6/2015 | Saenger et al. | |
| 2015/0323874 A1 | 11/2015 | Saenger | |
| 2017/0149198 A1 | 5/2017 | Wakabayashi et al. | |

FOREIGN PATENT DOCUMENTS

| | | |
|---|---|---|
| JP | 05-283320 A | 10/1993 |
| JP | 2003-133212 A | 5/2003 |
| JP | 2005-303084 A | 10/2005 |
| JP | 2009-105396 A | 5/2009 |
| JP | 2010-502003 A | 1/2010 |
| JP | 2010-278431 A | 12/2010 |
| JP | 2012-142460 A | 7/2012 |
| JP | 2012-533729 A | 12/2012 |
| JP | 2013-020926 A | 1/2013 |
| JP | 2013-53850 A | 3/2013 |
| JP | 2014-003290 A | 1/2014 |
| JP | 2015-511064 A | 4/2015 |
| JP | 2015-515140 A | 5/2015 |
| JP | 2015-523720 A | 8/2015 |
| JP | 2015-525906 A | 9/2015 |
| JP | 2015-534132 A | 11/2015 |
| WO | 2010/151304 A1 | 12/2010 |
| WO | 2011/096453 A1 | 8/2011 |
| WO | 2014/128010 A2 | 8/2014 |
| WO | 2014/202585 A2 | 12/2014 |
| WO | 2016/051518 A1 | 4/2016 |

OTHER PUBLICATIONS

Notification of Transmittal of Translation of the International Preliminary Report on Patentability (Chapter I) 3nd Translation of Written Opinion of the International Searching Authority; PCT/JP2016/055921; dated Aug. 28, 2018.

An Office Action mailed by the Japanese Patent Office dated Dec. 10, 2019, which corresponds to Japanese Patent Application No. 2018-501550 and is related to U.S. Appl. No. 16/028,240; with English language lanslation.

* cited by examiner

[Fig. 1]
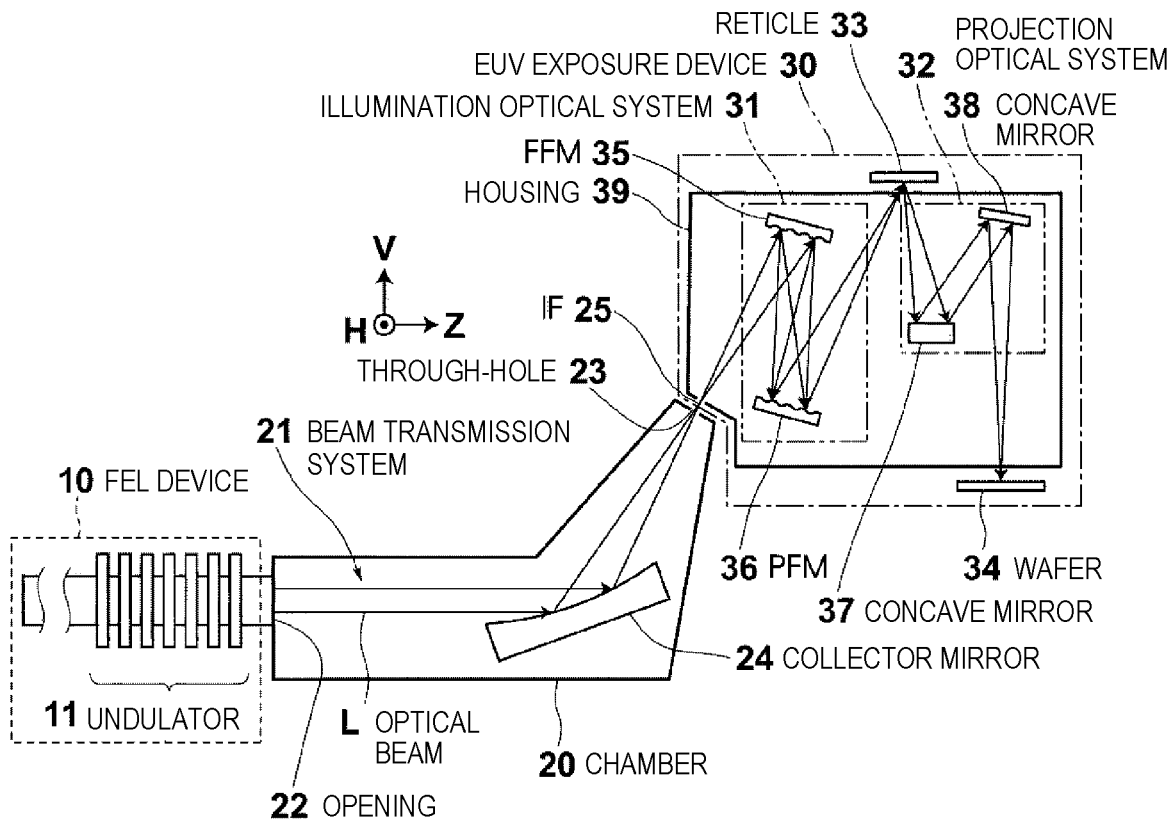

[Fig. 2]
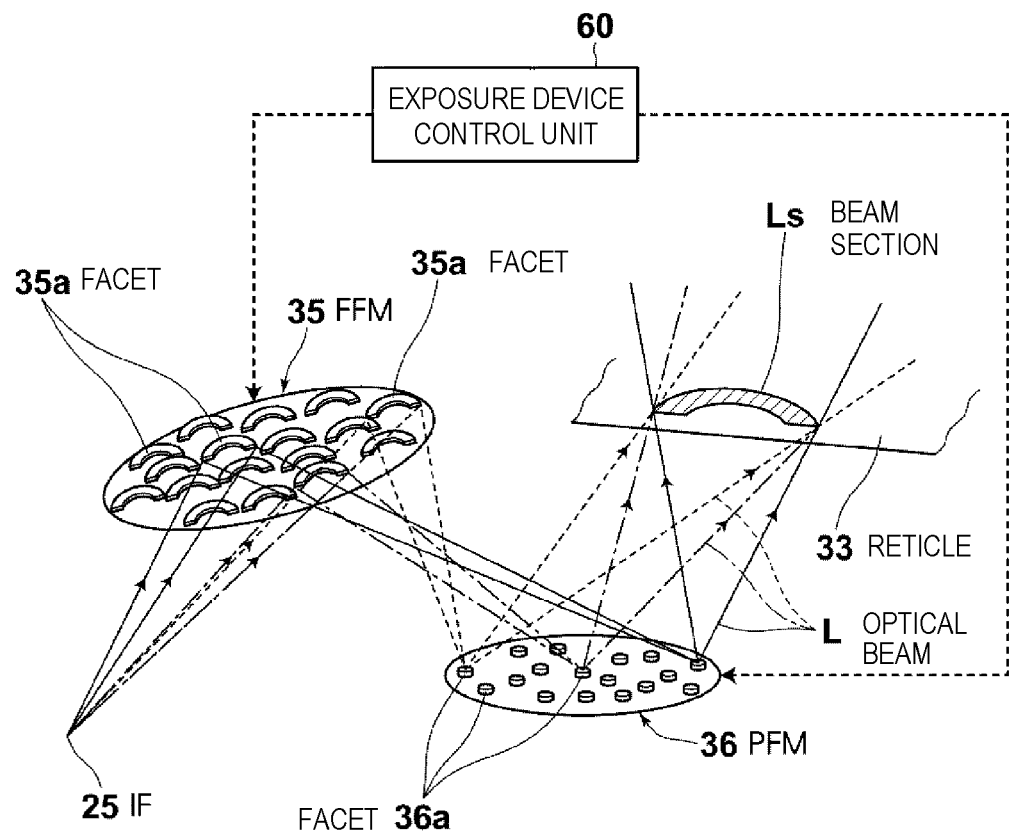
[Fig. 3]
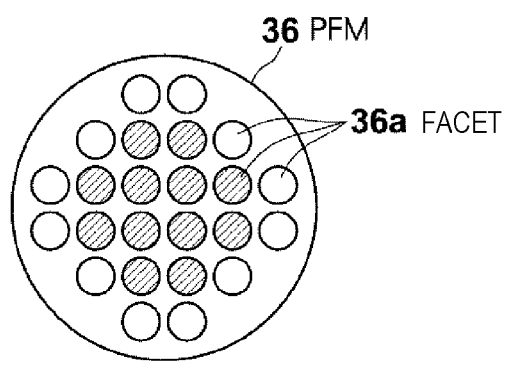

[Fig. 4]
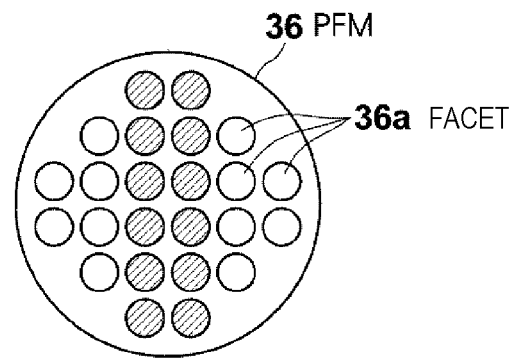
[Fig. 5]
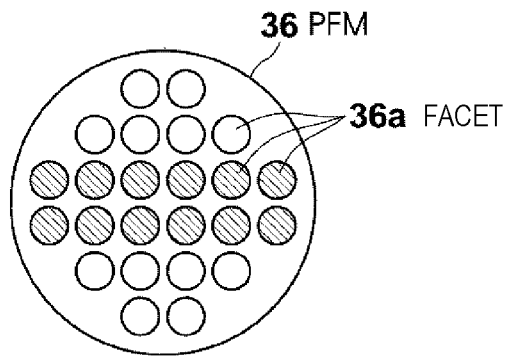

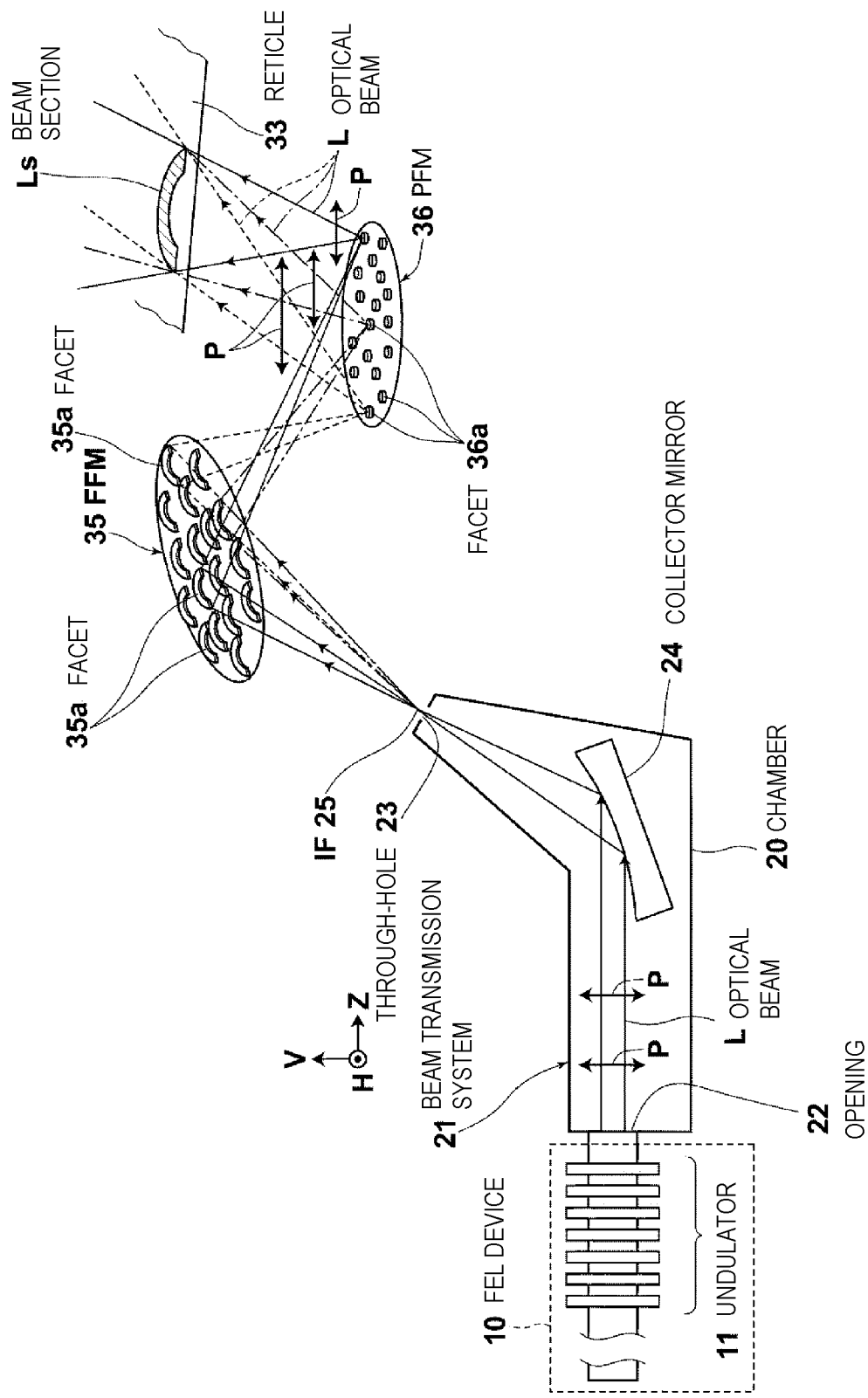
[Fig. 6]

[Fig. 7]
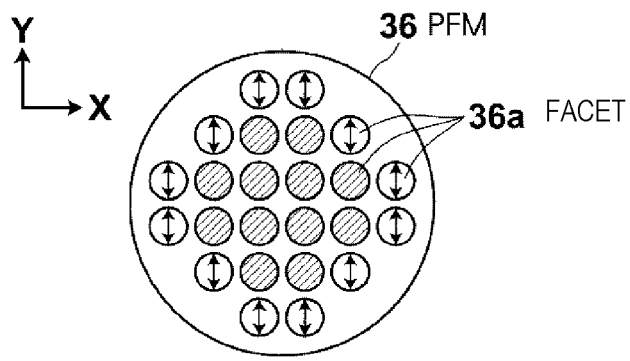
[Fig. 8]
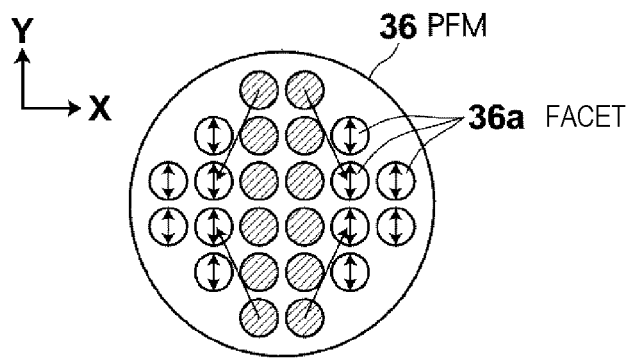
[Fig. 9]
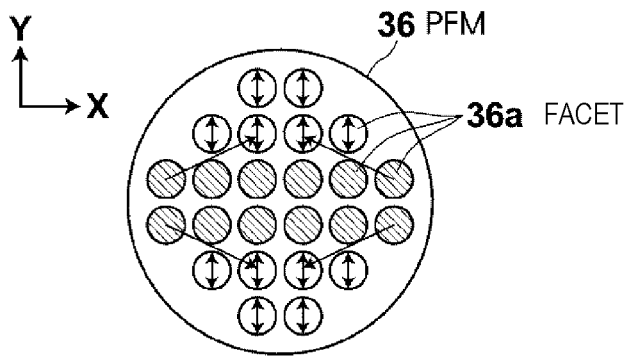

[Fig. 10]
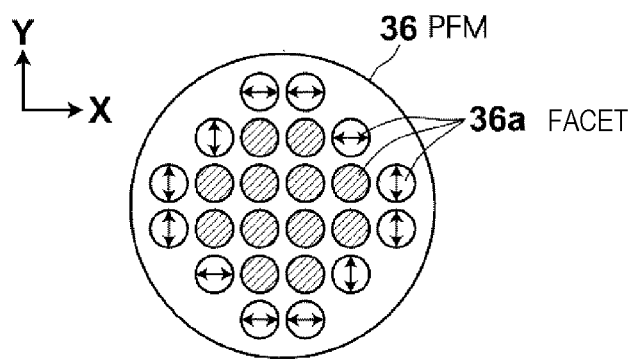
[Fig. 11]
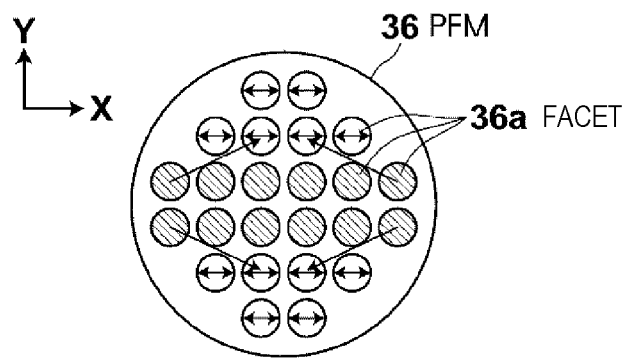

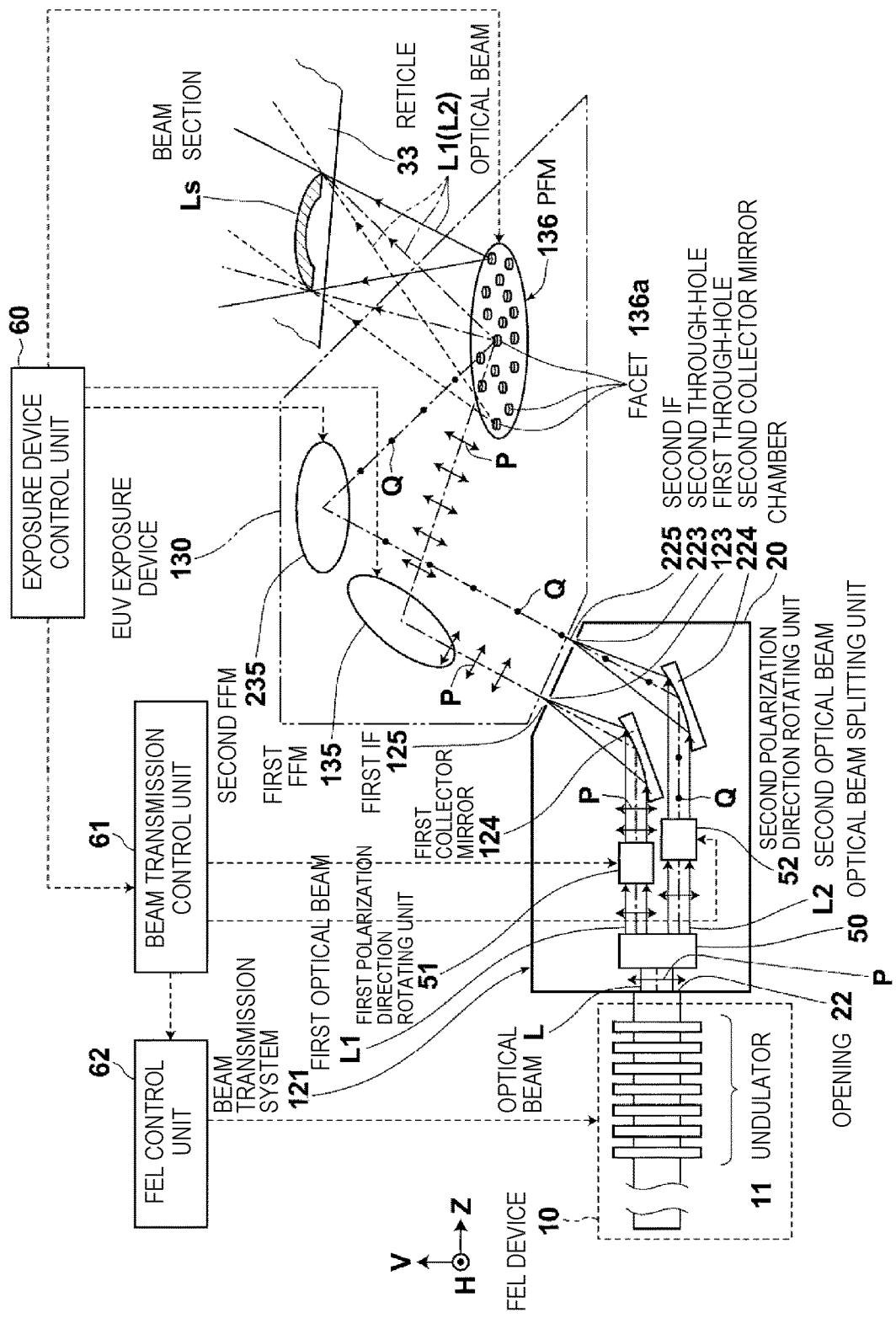
[Fig. 12]

[Fig. 13]
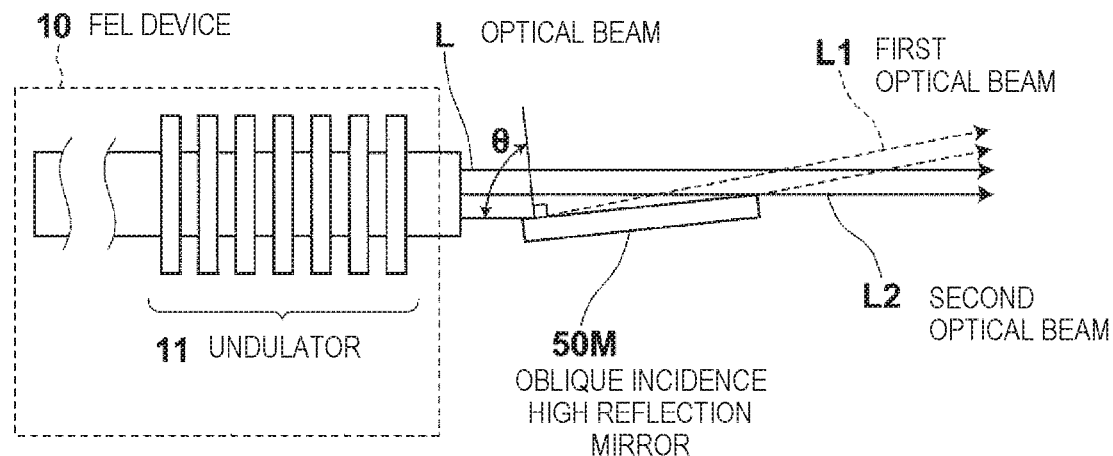
[Fig. 14]
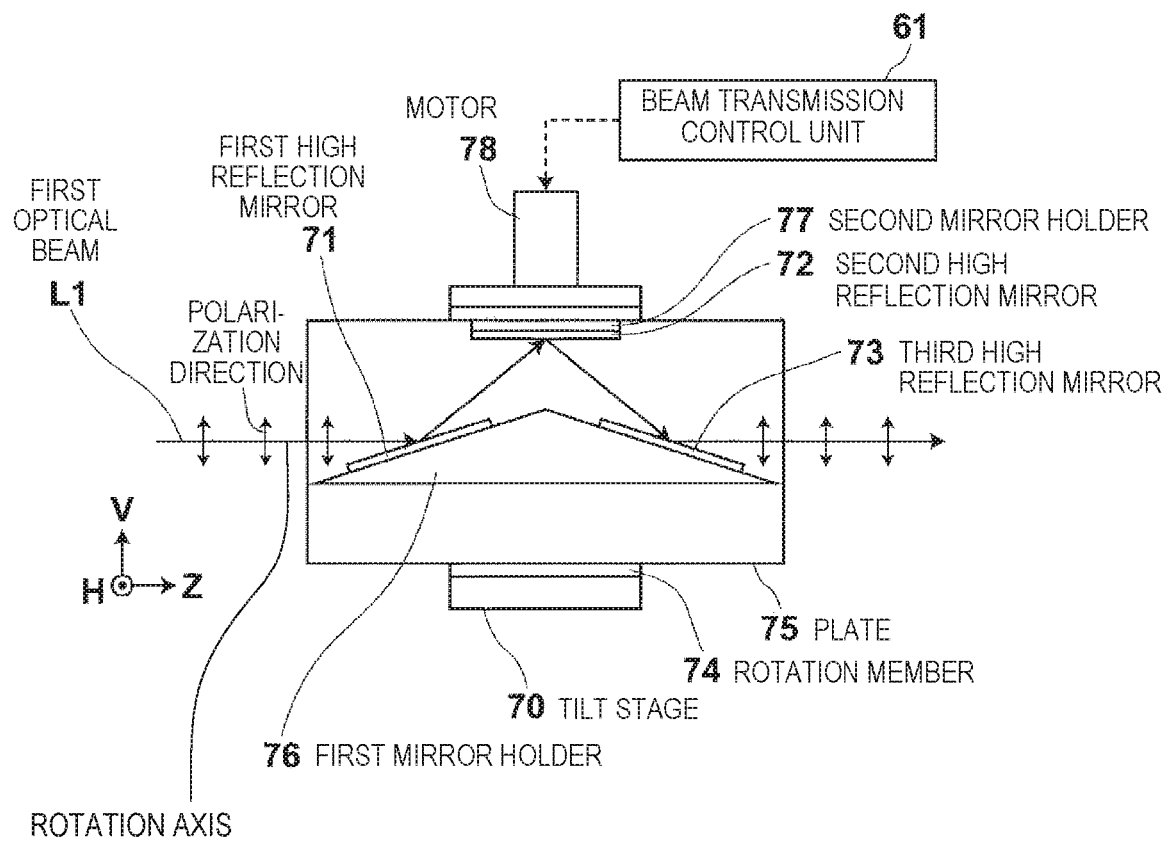

[Fig. 15]
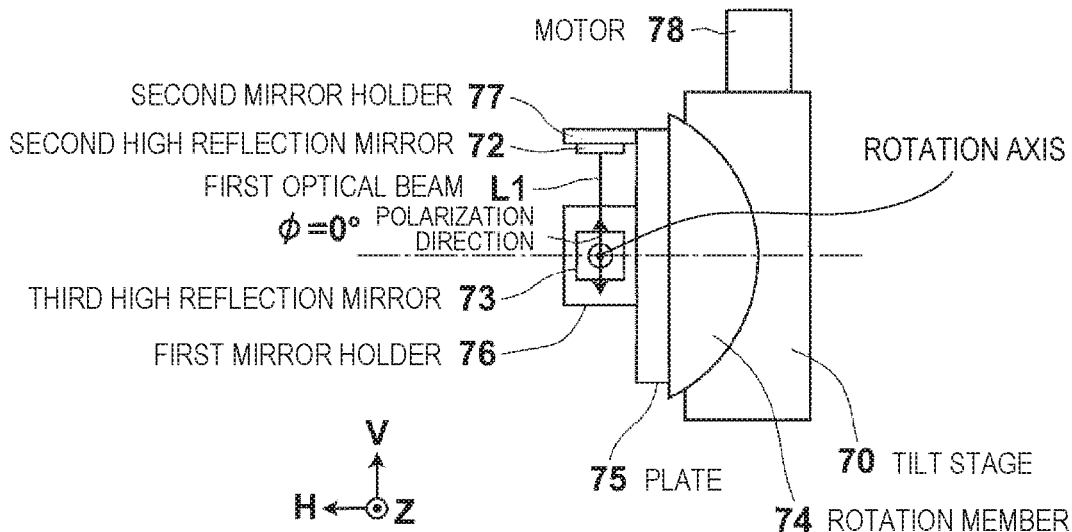
[Fig. 16]
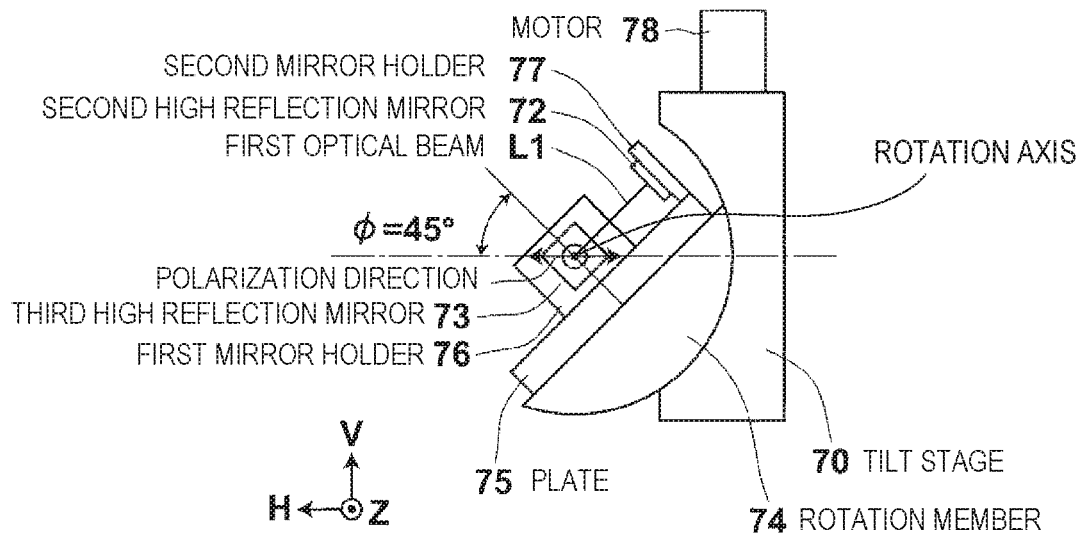

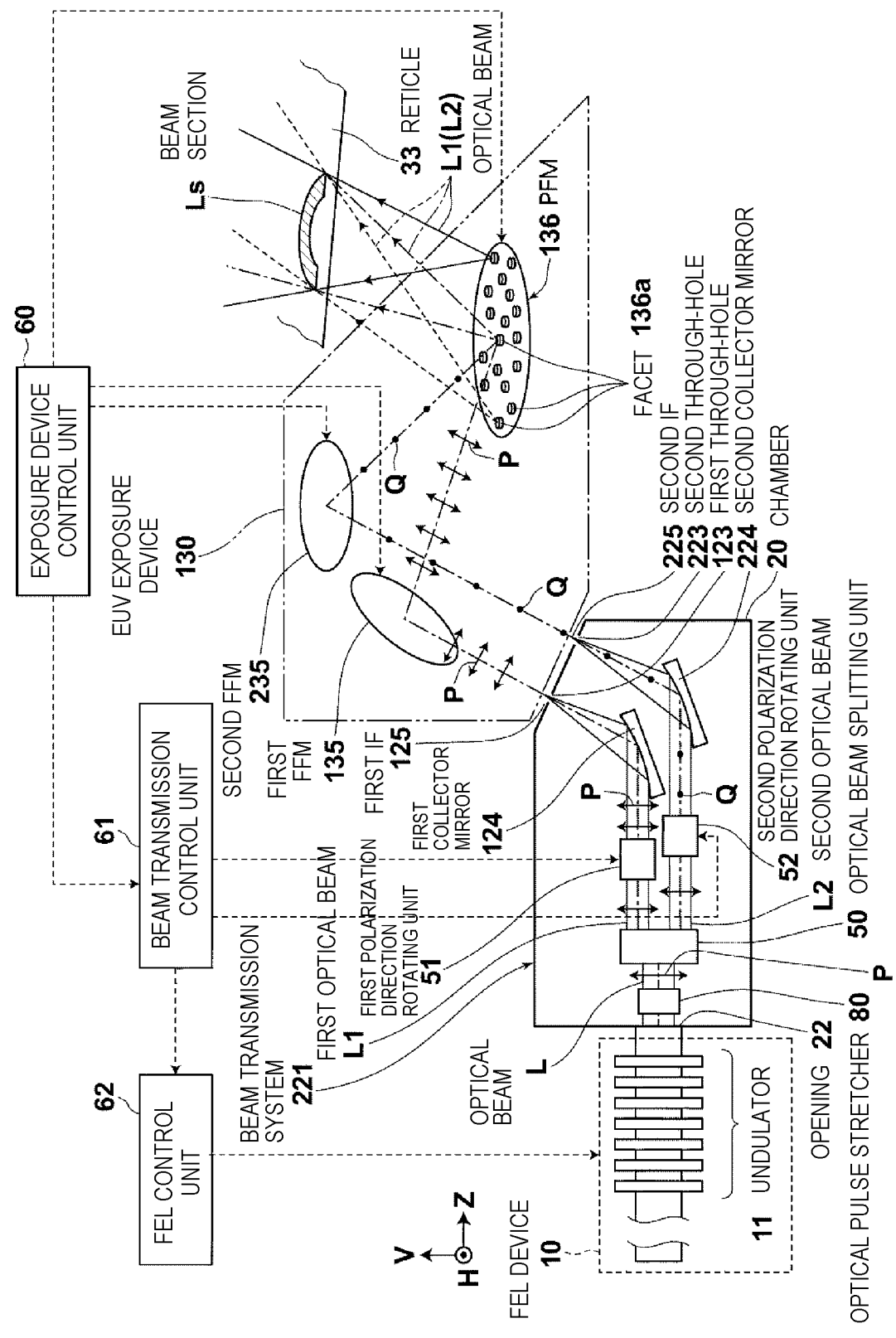
[Fig. 17]

[Fig. 18]
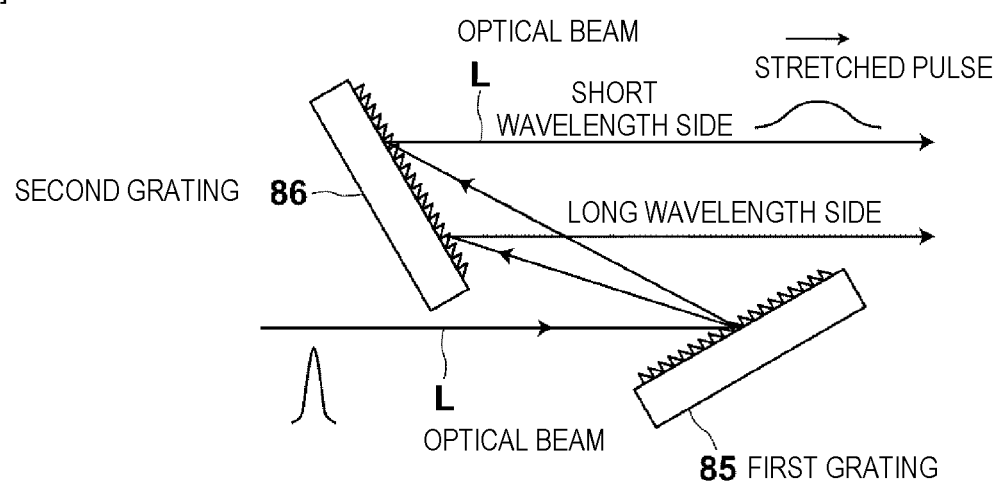

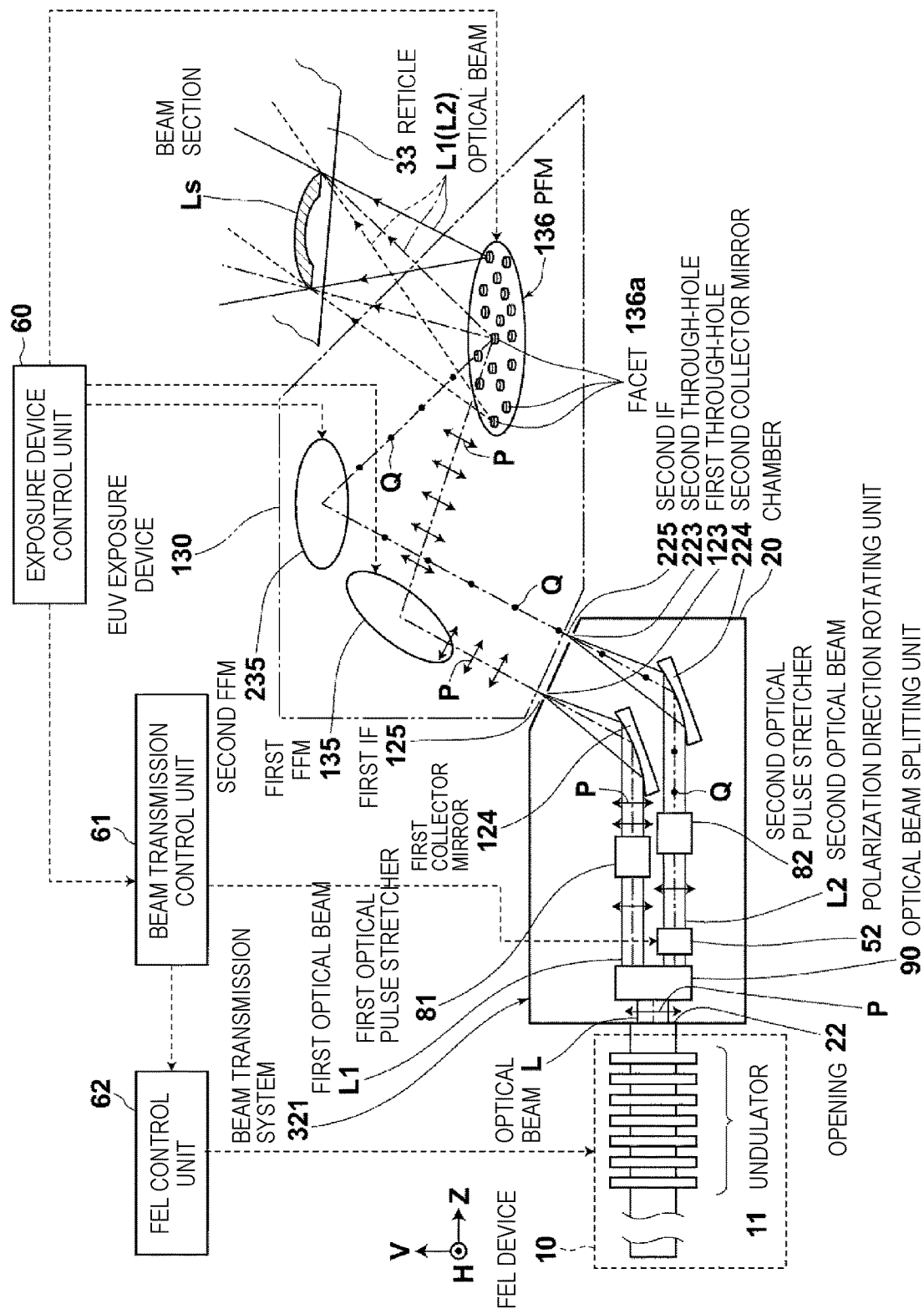
[Fig. 19]

[Fig. 20]
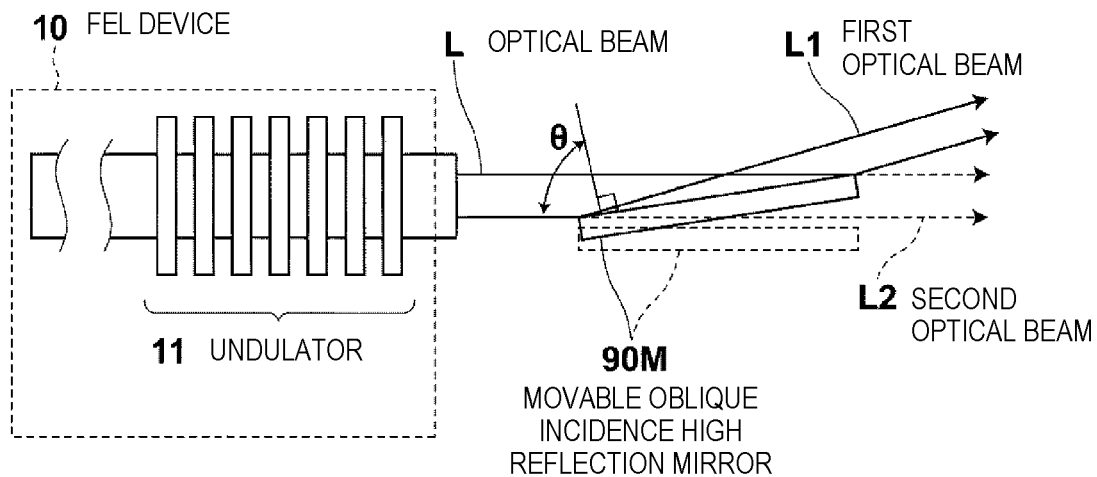
[Fig. 21]
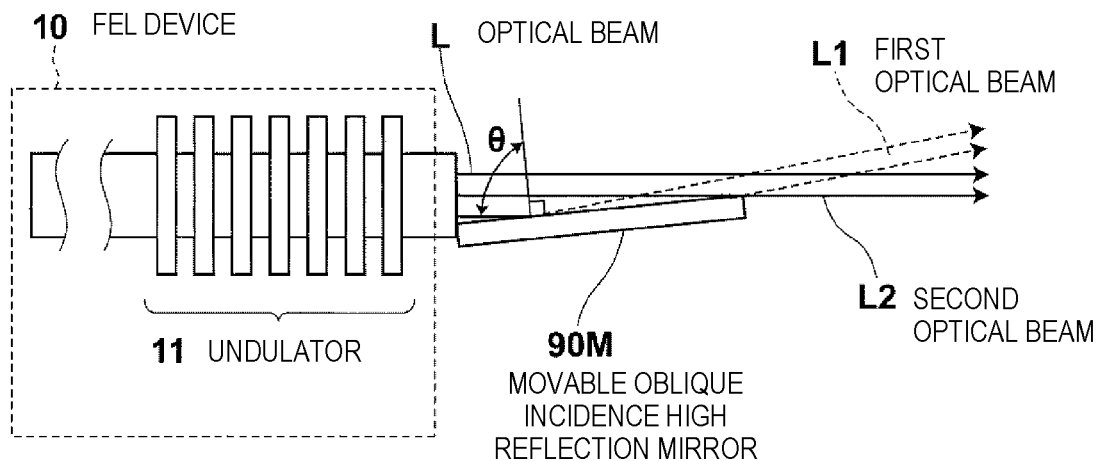

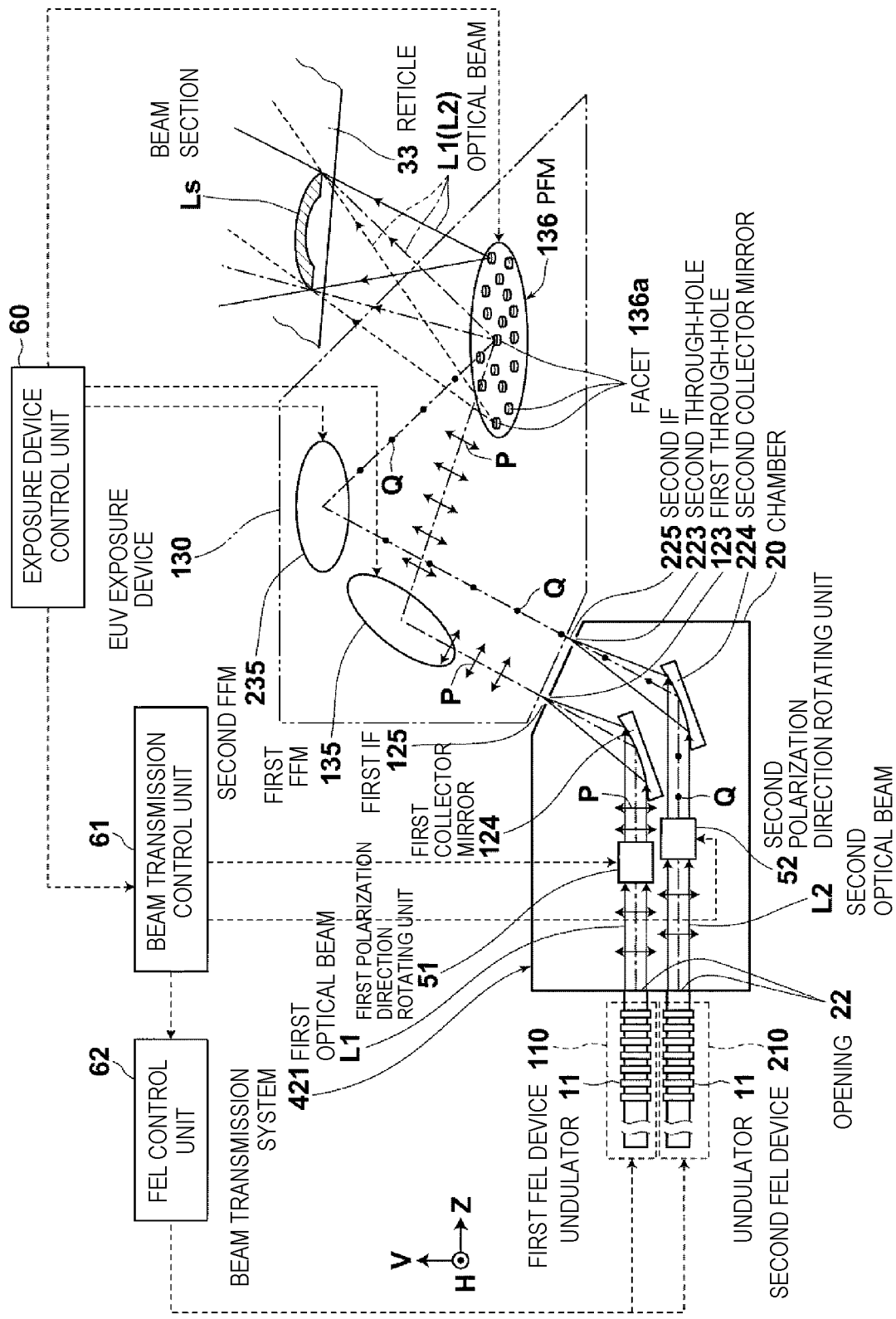

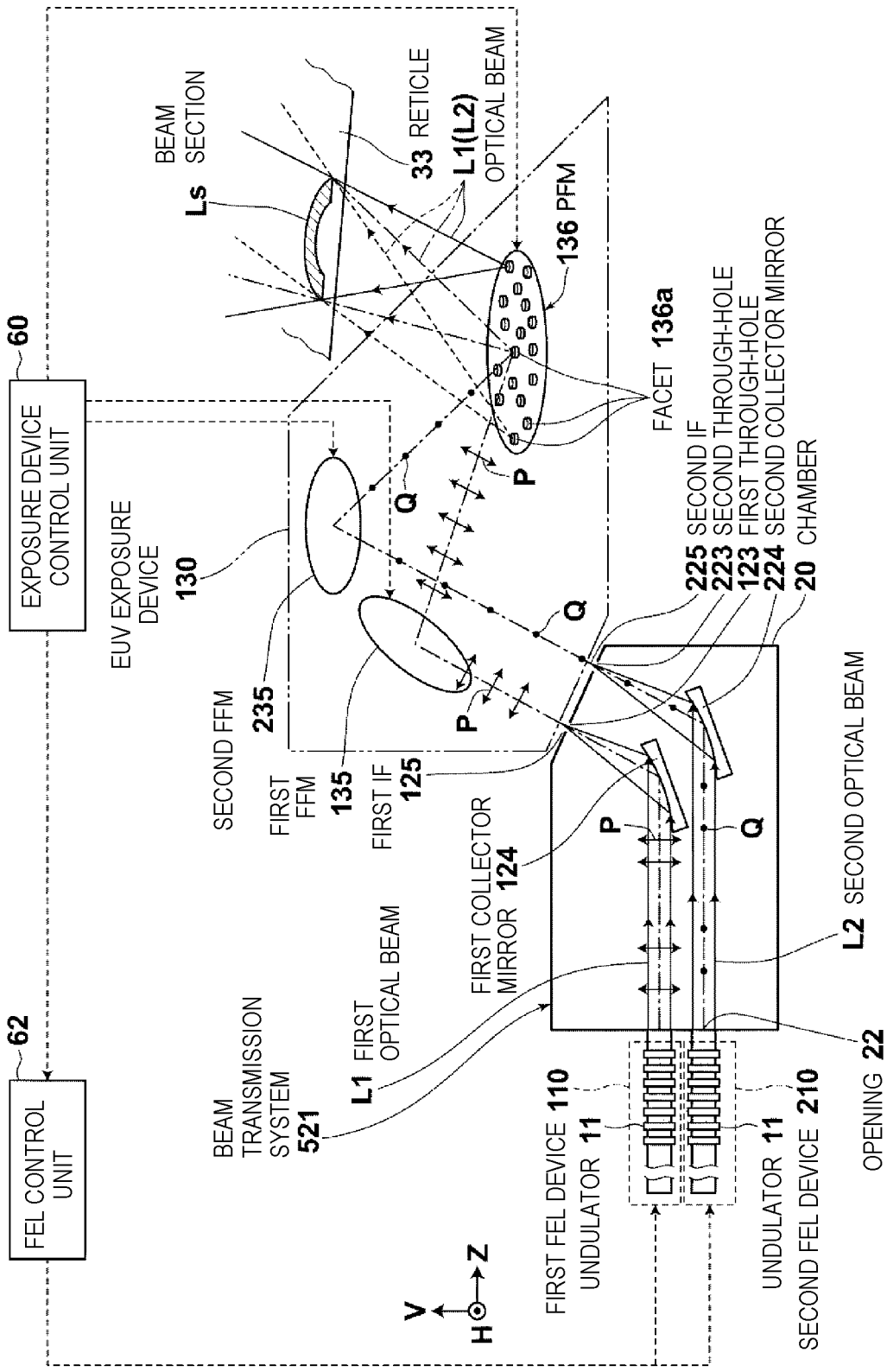
[Fig. 23]

[Fig. 24]
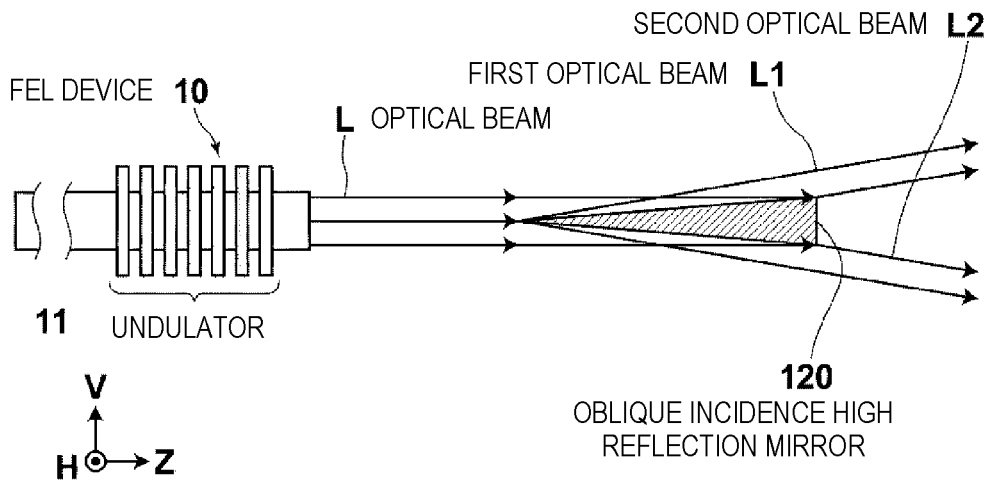
[Fig. 25]
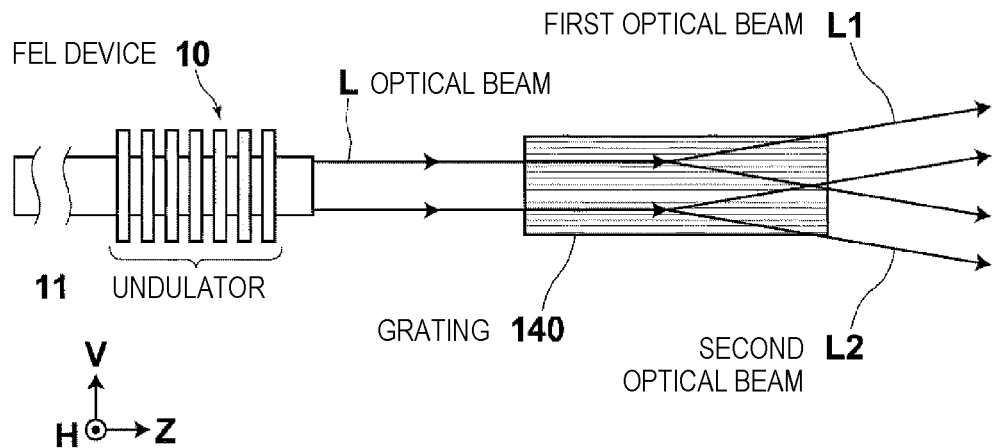
[Fig. 26]
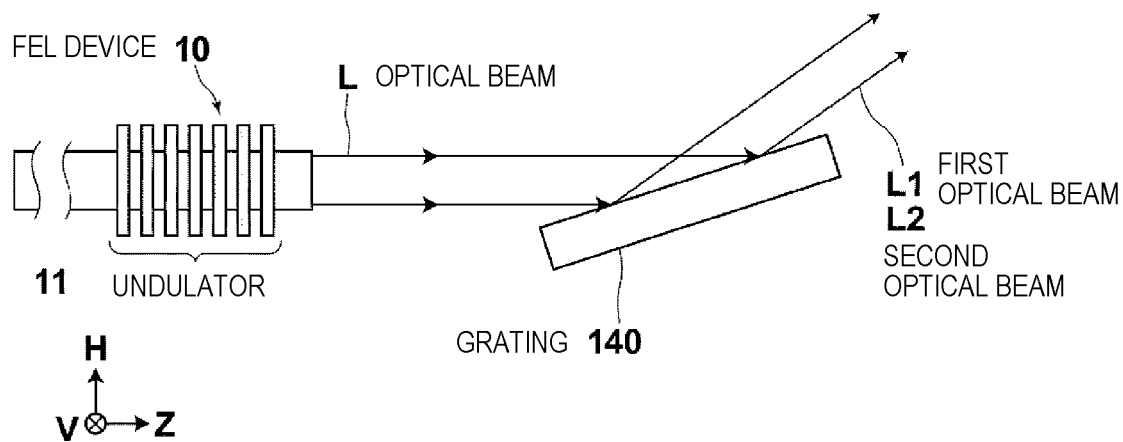

[Fig. 27]
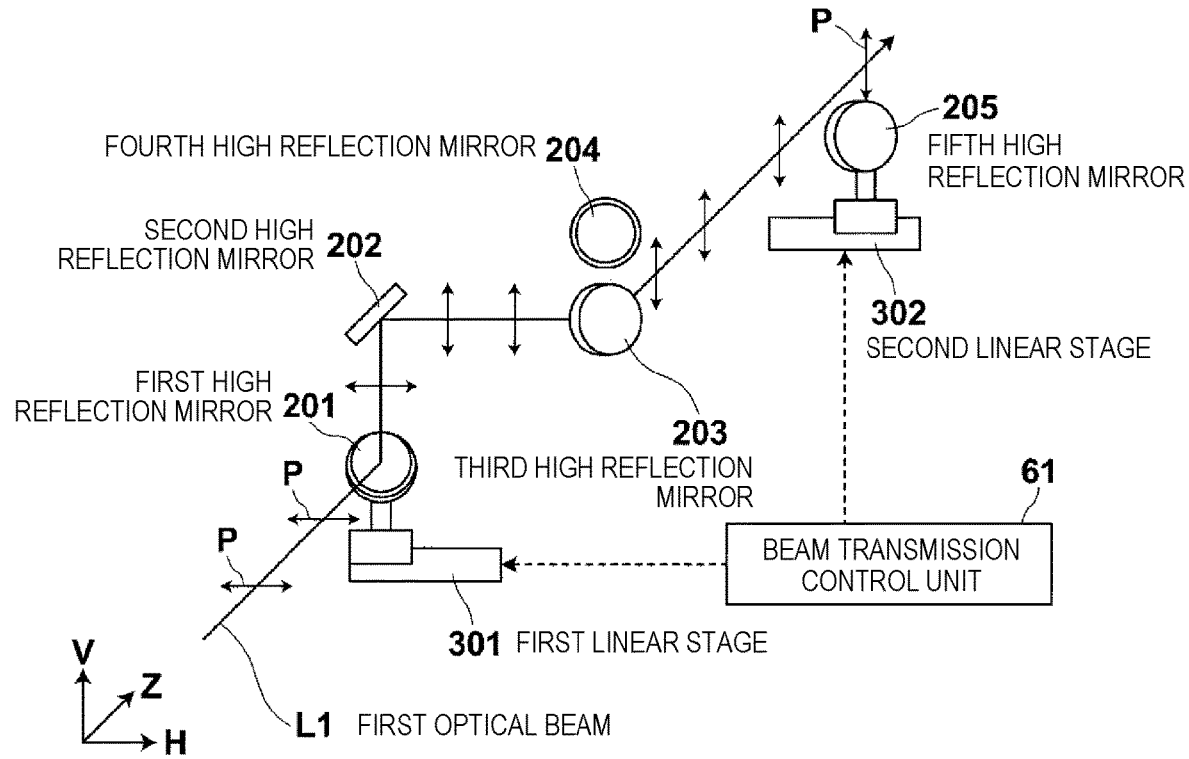
[Fig. 28]
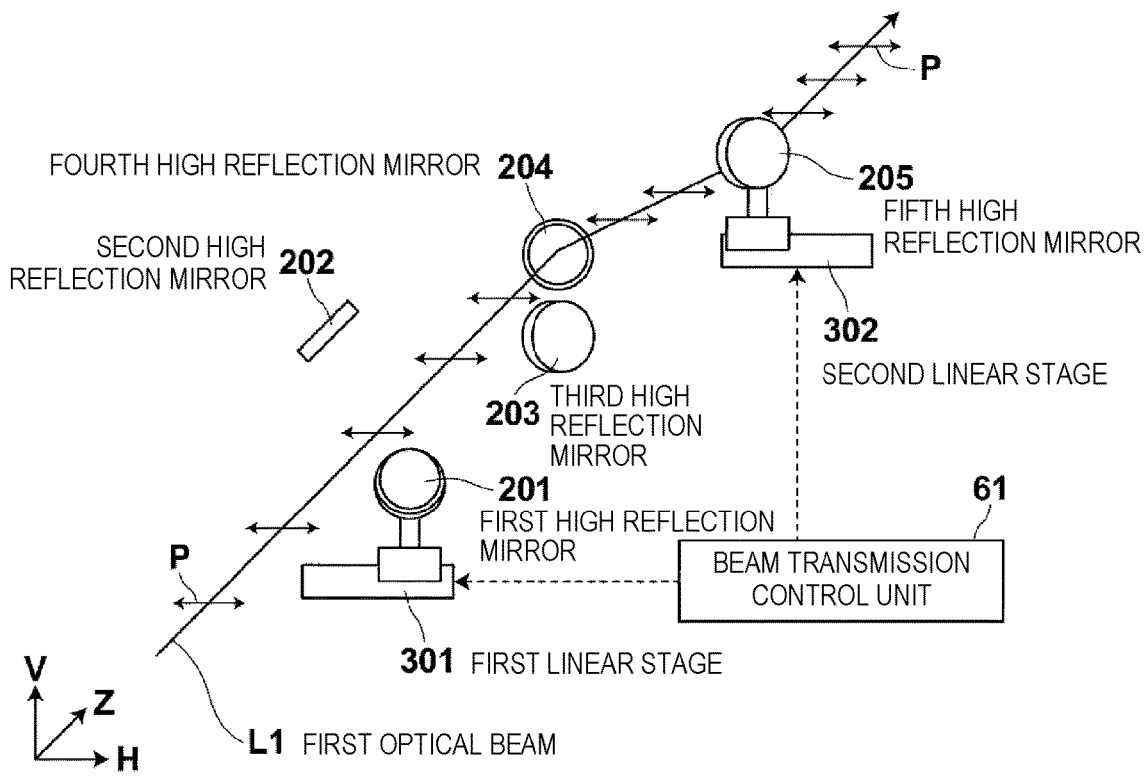

BEAM TRANSMISSION SYSTEM, EXPOSURE DEVICE, AND ILLUMINATION OPTICAL SYSTEM OF THE EXPOSURE DEVICE

CROSS-REFERENCE TO RELATED APPLICATIONS

The present application is a continuation application of International Application No. PCT/JP2016/055921 filed on Feb. 26, 2016. The content of the application is incorporated herein by reference in its entirety.

BACKGROUND

1. Technical Field

The present disclosure relates to an exposure device, an illumination optical system of the exposure device, and a system that transmits an exposure optical beam from a free electron laser device to the exposure device.

2. Related Art

Recently, rapid progress has been made in refinement of a transfer pattern for optical lithography in the semiconductor process along with refinement of the semiconductor process. Minute fabrication at 20 nm or smaller is requested for the next generation technology. The request for minute fabrication at 20 nm or smaller is expected to be met by developing, for example, an exposure device including a combination of an extreme ultraviolet (EUV) light generation device configured to generate extreme ultraviolet light having a wavelength of 13.5 nm and a reduced projection reflective optics.

Three kinds of disclosed EUV light generation devices are a laser produced plasma (LPP) device that uses plasma generated by irradiating a target material with pulse laser light, a discharge produced plasma (DPP) device that uses plasma generated by electrical discharging, and a free electron laser device that uses electrons output from an electron accelerator.

CITATION LIST

Patent Literature

Patent Literature 1: National Publication of International Patent Application No. 2015-525906
Patent Literature 2: National Publication of International Patent Application No. 2015-523720
Patent Literature 3: National Publication of International Patent Application No. 2012-533729
Patent Literature 4: Japanese Unexamined Patent Application Publication No. 2014-3290
Patent Literature 5: US Published Patent Application No. 2015/0323874
Patent Literature 6: US Published Patent Application No. 2015/0173163

SUMMARY

According to an aspect of the present disclosure, a beam transmission system that transmits, to an exposure device, a linearly polarized optical beam output from a free electron laser device, includes: an optical beam splitting unit configured to split the optical beam into a first optical beam and a second optical beam; and a first polarization direction rotating unit configured to rotate a linear polarization direction of the first optical beam.

According to another aspect of the present disclosure, a beam transmission system that transmits, to an exposure device, a linearly polarized optical beam output from a free electron laser device, includes: a first free electron laser device configured to output a first optical beam; a second free electron laser device configured to output a second optical beam; and a first polarization direction rotating unit configured to rotate a linear polarization direction of the first optical beam.

According to an aspect of the present disclosure, an illumination optical system of an exposure device that illuminates the illumination surface of the exposure device with the optical beam transmitted by the exposure device according to the aspect of the present disclosure or the beam transmission system according to the other aspect of the present disclosure, includes: a first field facet mirror irradiated with the first optical beam; a second field facet mirror irradiated with the second optical beam; and a pupil facet mirror irradiated with the first optical beam via the first field facet mirror and the second optical beam via the second field facet mirror.

BRIEF DESCRIPTION OF THE DRAWINGS

Embodiments of the present disclosure will be described as examples below with reference to the accompanying drawings.

FIG. 1 is a schematic side view illustrating an exemplary configuration of a beam transmission system and an illumination optical system of an exposure device;

FIG. 2 is a perspective view illustrating a schematic configuration of the illumination optical system illustrated in FIG. 1;

FIG. 3 is a schematic diagram illustrating the state of a pupil facet mirror for description of an exemplary shape of illumination light;

FIG. 4 is a schematic diagram illustrating the state of the pupil facet mirror for description of another exemplary shape of illumination light;

FIG. 5 is a schematic diagram illustrating the state of the pupil facet mirror for description of another exemplary shape of illumination light;

FIG. 6 is a schematic view illustrating the configuration of a beam transmission system and an illumination optical system of an exposure device according to a comparative example;

FIG. 7 is a schematic diagram illustrating the state of the pupil facet mirror for description of an exemplary shape of illumination light and an exemplary linear polarization direction;

FIG. 8 is a schematic diagram illustrating the state of the pupil facet mirror for description of another exemplary shape of illumination light and another exemplary linear polarization direction;

FIG. 9 is a schematic diagram illustrating the state of the pupil facet mirror for description of another exemplary shape of illumination light and another exemplary linear polarization direction;

FIG. 10 is a schematic diagram illustrating the state of the pupil facet mirror for description of a preferable exemplary shape of illumination light and a preferable exemplary linear polarization direction;

FIG. 11 is a schematic diagram illustrating the state of the pupil facet mirror for description of another preferable exemplary shape of illumination light and another preferable exemplary linear polarization direction;

FIG. 12 is a schematic view illustrating the configuration of a beam transmission system and an illumination optical system of an exposure device according to Embodiment 1;

FIG. 13 is a side view illustrating a detailed structure of an optical beam splitting unit used in the configuration illustrated in FIG. 12;

FIG. 14 is a side view illustrating a detailed structure of a polarization direction rotating unit used in the configuration illustrated in FIG. 12;

FIG. 15 is a front view illustrating the detailed structure of the polarization direction rotating unit used in the configuration illustrated in FIG. 12;

FIG. 16 is a front view illustrating the polarization direction rotating unit illustrated in FIG. 15 in another state;

FIG. 17 is a schematic view illustrating the configuration of a beam transmission system and an illumination optical system of an exposure device according to Embodiment 2;

FIG. 18 is a side view illustrating a detailed structure of an optical pulse stretcher used in the configuration illustrated in FIG. 17;

FIG. 19 is a schematic view illustrating the configuration of a beam transmission system and an illumination optical system of an exposure device according to Embodiment 3;

FIG. 20 is a side view illustrating a detailed structure of an optical beam splitting unit used in the configuration illustrated in FIG. 19;

FIG. 21 is a side view illustrating the optical beam splitting unit illustrated in FIG. 20 in another state;

FIG. 22 is a schematic view illustrating the configuration of a beam transmission system and an illumination optical system of an exposure device according to Embodiment 4;

FIG. 23 is a schematic view illustrating the configuration of a beam transmission system and an illumination optical system of an exposure device according to Embodiment 5;

FIG. 24 is a side view illustrating an optical beam splitting unit according to Modification 1;

FIG. 25 is a side view illustrating an optical beam splitting unit according to Modification 2;

FIG. 26 is a top view illustrating the optical beam splitting unit according to Modification 2;

FIG. 27 is a perspective view illustrating a polarization direction rotating unit according to Modification 1; and FIG. 28 is a perspective view illustrating the polarization direction rotating unit illustrated in FIG. 27 in another state.

EMBODIMENTS

<Contents>
1. Overall description of EUV exposure device and beam transmission system
1.1 Configuration
1.2 Operation
2. Comparative example
2.1 Configuration of comparative example
2.2 Operation of comparative example
2.3 Problem of comparative example
3. Embodiment 1
3.1 Configuration of Embodiment 1
3.2 Operation of Embodiment 1
3.3 Effects of Embodiment 1
4. Embodiment 2
4.1 Configuration of Embodiment 2
4.2 Operation of Embodiment 2
4.3 Effects of Embodiment 2
5. Embodiment 3
5.1 Configuration of Embodiment 3
5.2 Operation of Embodiment 3
5.3 Effects of Embodiment 3
6. Embodiment 4
6.1 Configuration of Embodiment 4
6.2 Operation of Embodiment 4
6.3 Effects of Embodiment 4
7. Embodiment 5
7.1 Configuration of Embodiment 5
7.2 Operation of Embodiment 5
7.3 Effects of Embodiment 5
8. Modification 1 of optical beam splitting unit
8.1 Configuration of Modification 1 of optical beam splitting unit
8.2 Operation of Modification 1 of optical beam splitting unit
8.3 Effects of Modification 1 of optical beam splitting unit
9. Modification 2 of optical beam splitting unit
9.1 Configuration of Modification 2 of optical beam splitting unit
9.2 Operation of Modification 2 of optical beam splitting unit
10. Modification 1 of polarization direction rotating unit
10.1 Configuration of Modification 1 of polarization direction rotating unit
10.2 Operation of Modification 1 of polarization direction rotating unit
10.3 Effects of Modification 1 of polarization direction rotating unit Embodiments of the present disclosure will be described in detail below with reference to the accompanying drawings.

The embodiments described below are merely examples of the present disclosure, and do not limit the content of the present disclosure. Not all configurations and operations described in the embodiments are necessarily essential configurations and operations of the present disclosure. Any identical components are denoted by an identical reference sign, and duplicate description thereof will be omitted.

1. Overall Description of EUV Exposure Device and Beam Transmission System 1.1 Configuration FIG. 1 schematically illustrates an EUV exposure device, and a beam transmission system that transmits an exposure optical beam from a free electron laser device to the EUV exposure device. Hereinafter, a free electron laser device is referred to as an FEL device. FIG. 1 schematically illustrates side shapes of a beam transmission system 21 including an FEL device 10, and an EUV exposure device 30.

In the present disclosure, a Z direction is defined to be the traveling direction of an optical beam emitted from the FEL device 10. An H direction is defined to be a direction parallel to a surface on which the FEL device 10 is placed and orthogonal to the Z direction. A V direction is defined to be a direction orthogonal to the Z direction and the H direction. The H direction is aligned with the horizontal direction and the V direction is aligned with the vertical direction when the FEL device 10 and the EUV exposure device 30 are used in a normal state.

As illustrated in FIG. 1, the FEL device 10 includes an undulator 11 configured to control the linear polarization direction of pulse laser light to be output. An optical beam L transmitted through the beam transmission system 21 according to the present embodiment is pulse laser light output from the FEL device 10.

The beam transmission system 21 includes a chamber 20, an opening 22 provided to the chamber 20, a through-hole 23 provided to the chamber 20, and a collector mirror 24 disposed in the chamber 20.

The optical beam L emitted from the FEL device 10 is incident in the chamber 20 through the opening 22. The opening 22 is desirably sealed through, for example, an 0 ring or welded to an output unit of the FEL device 10. The collector mirror 24 is, for example, an off-axis parabolic mirror. The collector mirror 24 is disposed such that the optical beam L emitted from the FEL device 10 is incident on the collector mirror 24 at a predetermined incident angle. The collector mirror 24 is disposed such that the incident optical beam L is collected at an intermediate focus (IF) 25 and then is incident in the EUV exposure device 30. The above-described intermediate focus is referred to as the IF in the following description and the drawings.

The optical beam L travels out of the chamber 20 through the through-hole 23. The through-hole 23 is desirably sealed to an optical beam input unit of the EUV exposure device 30 by a seal member (not illustrated). Any gas in the chamber 20 is desirably discharged by a discharge device (not illustrated) and maintained in a highly vacuum state so that attenuation of the optical beam L is reduced.

The EUV exposure device 30 includes an illumination optical system 31, a projection optical system 32, a reticle 33, a wafer 34, and a housing 39.

The illumination optical system 31 includes a field facet mirror (FFM) 35 and a pupil facet mirror (PFM) 36. In the following description and the drawings, a field facet mirror is referred to as an FFM, and a pupil facet mirror is referred to as a PFM. The FFM 35 and the PFM 36 are disposed to divide the optical beam L into a plurality of optical beams L each to be formed into a plurality of slits on the reticle 33 as an illumination surface so that the reticle 33 is illuminated with the slits. The FFM 35 and the PFM 36 are disposed such that the optical beams L have predetermined angle distribution relative to the reticle 33. In addition, the FFM 35 and the PFM 36 are disposed such that all slits substantially overlap with each other on the reticle 33.

The projection optical system 32 includes a concave mirror 37 and a concave mirror 38. The concave mirror 37 and the concave mirror 38 are disposed to project and form, on the wafer 34, an image of the reticle 33 being illuminated.

The projection optical system 32 is a combination of a plurality of mirrors, and may include larger numbers of concave mirrors and convex mirrors.

The EUV exposure device 30 includes a scanning mechanism (not illustrated) configured to synchronously scan the reticle 33 and the wafer 34 relative to the illumination optical system 31 and the projection optical system 32.

The following describes the illumination optical system 31 in detail with reference to FIG. 2. The illumination optical system 31 includes the FFM 35 and the PFM 36. The FFM 35 and the PFM 36 are what is called micro electro mechanical systems (MEMS) produced by using, for example, a silicon substrate.

The FFM 35 includes a plurality of facets (field facets) 35a. Each facet 35a is, for example, a minute mirror having a concave surface in an arc shape. Each slit with which the reticle 33 is irradiated has the shape of the facet 35a as a minute mirror. Each facet 35a is coupled with an actuator (not illustrated) configured to change the angle of the facet 35a by, for example, electrostatic force.

The PFM 36 includes a plurality of facets (pupil facets) 36a. Each facet 36a is, for example, a minute mirror having a concave surface in a circular shape. Each facet 36a is coupled with an actuator (not illustrated) configured to change the angle of the facet 36a by, for example, electrostatic force.

Each facet 35a of the FFM 35 forms an image at the IF 25 onto the corresponding one of the facets 36a of the PFM 36. The PFM 36 is disposed to form the image of the corresponding facet 35a reflected on each facet 36a onto the reticle 33 in an overlapping manner.

The angles of the facets 35a of the FFM 35 and the facets 36a of the PFM 36 are individually set by an exposure device control unit 60 controlling drive of the actuators.

1.2 Operation

In the configuration described above with reference to FIG. 1, an optical beam L that is pulse laser light output from the FEL device 10 is incident in the chamber 20. The optical beam L is incident on the collector mirror 24 at a predetermined angle and reflected. The reflected optical beam L is collected at the IF 25. The collected optical beam L is incident in the EUV exposure device 30 through the through-hole 23 of the chamber 20.

The optical beam L incident in the EUV exposure device 30 is formed into a scanning slit shape on the reticle 33 through the illumination optical system 31. All optical beams L formed in the scanning slit shape are incident on the reticle 33 in a substantially overlapping manner. In FIG. 2, a resulting sectional shape of the optical beams L in the slit shape is denoted by Ls. The optical beams L each thus formed in the slit shape by the FFM 35 are converted to have predetermined angle distribution relative to the reticle 33 and incident on the reticle 33 at uniform illuminance through the PFM 36.

The optical beams L incident on the reticle 33 are reflected on the reticle 33 and incident on the wafer 34 through the projection optical system 32. Accordingly, an image of an illuminated part of the reticle 33 is transferred and formed onto a photoresist on the wafer 34.

The reticle 33 and the wafer 34 are synchronously scanned relative to the illumination optical system 31 and the projection optical system 32 by the above-described scanning mechanism, and accordingly, the entire image of the reticle 33 is transferred and formed onto the photoresist on the wafer 34. The speed of scanning the reticle 33 and the speed of scanning the wafer 34 are set to have a ratio in accordance with the magnification of the projection optical system 32.

The following describes operation of the FFM 35 and the PFM 36 of the illumination optical system 31 with reference to FIG. 2. The exposure device control unit 60 determines an optimum shape of illumination light for a pattern of the reticle 33. Typically, a plurality of reticles 33 are sequentially replaced and used at exposure of each wafer 34, and the optimum shape of illumination light is determined for each reticle 33. The exposure device control unit 60 controls the angle of each facet 35a of the FFM 35 and the angle of each facet 36a of the PFM 36 to obtain the determined shape of illumination light. This angle control is performed by controlling drive of the actuators coupled with the facets 35a and 36a as described above.

Examples of the shape of illumination light described above will be described with reference to FIGS. 3 to 5. FIGS. 3 to 5 each schematically illustrate the shape of illumination light with the PFM 36. In FIGS. 3 to 5, a large circle represents the PFM 36, and 24 small circles illustrated in the large circle represent the facets 36a of the PFM 36. Each white circle representing one of the 24 facets 36a indicates a state in which the angle of the corresponding facet 35a of the FFM 35 is set so that an optical beam L divided at the facet 35a of the FFM 35 is incident on the facet 36a.

Each hatched facet 36a indicates a state in which no optical beam L divided at the corresponding facet 35a of the FFM 35 is incident on the facet 36a. The reticle 33 is illuminated with the optical beams L at angle distribution in accordance with the disposition pattern of the facets 36a represented by white circles.

For example, as illustrated in FIG. 3, the reticle 33 is illuminated with an optical beam L reflected on a plurality of facets 36a continuous with each other in a schematically circular ring. In this case, the optical beam L spreading from the IF 25 illustrated in FIG. 2 is incident and reflected on the plurality of facets 35a of the FFM 35. Accordingly, the optical beam L is divided at the plurality of facets 35a and emitted from the FFM 35. These divided optical beams L are incident on, among the facets 36a of the PFM 36, those continuous with each other in the schematically circular ring.

The reticle 33 is illuminated with the divided optical beams L reflected on the plurality of facets 36a. The optical beams L on the reticle 33 form images of the arc-shaped facets 35a of the FFM 35 in a substantially overlapping manner. Accordingly, the reticle 33 is illuminated at uniform illuminance through the arc shape as a slit. The reticle 33 is illuminated at angle distribution shaped in the schematically circular ring.

Alternatively, when the angles of the facets 35a and 36a are set so that a pattern illustrated in FIG. 4 is obtained, the reticle 33 is illuminated at angle distribution of illumination light in a bipolar shape of divisions on the right and left sides. In addition, when the angles of the facets 35a and 36a are set so that a pattern illustrated in FIG. 5 is obtained, the reticle 33 is illuminated at angle distribution of illumination light in a bipolar shape of divisions on the upper and lower sides.

2. Comparative Example 2.1 Configuration of Comparative Example

FIG. 6 is a schematic view illustrating the beam transmission system 21 according to a comparative example for the present invention. Similarly to the configuration illustrated in FIG. 1, a single optical beam L is output from the FEL device 10 in the configuration illustrated in FIG. 6. The optical beam L is linearly polarized in one direction indicated with Arrow P in FIG. 6.

2.2 Operation of the Comparative Example

Similarly to the configuration illustrated in FIG. 1, an optical beam L is divided into a plurality of beams in the configuration according to the comparative example. Then, the reticle 33 is illuminated with the divided optical beams L. The optical beams L incident on the reticle 33 are linearly polarized in the same direction.

2.3 Problem of the Comparative Example

In an EUV exposure device, as described above, the resolving power of a projection optical system is desired to be increased to meet the request for minute fabrication. The request can be satisfied by increasing the numerical aperture (NA) of the projection optical system. However, when the NA of the projection optical system is increased to, for example, 0.5 or larger, an imaging optical beam is incident on a resist on a wafer at such a large angle that the polarization of illumination light has measurable influence. For example, when line and space at 1:1 with a half pitch of 10 nm or smaller is imaged with extreme ultraviolet light having a wavelength of 13.5 nm through p polarization, the contrast of an optical image decreases by 20% or more. To prevent this contrast decrease, not only the shape of illumination light but also the linear polarization direction thereof need to be controlled in accordance with the pattern of a reticle.

However, in the configuration illustrated in FIG. 6 according to the comparative example, the linear polarization direction of illumination light is fixed to the one direction in accordance with the linear polarization direction of the optical beam L when emitted from the FEL device 10. Thus, with the configuration according to the comparative example, it is difficult to set the linear polarization direction of illumination light to be a preferable direction in accordance with the pattern of a reticle.

The above-described problem is more specifically described below. FIGS. 7, 8, and 9 illustrate the linear polarization direction of illumination light set in the configuration illustrated in FIG. 6 according to the comparative example when the illumination light has the above-described shapes illustrated in FIGS. 3, 4, and 5, respectively. In FIGS. 7, 8, and 9, the linear polarization direction is indicated by an arrow illustrated in each facet 36a. X and Y directions are orthogonal to each other in a plane in which the facets 36a are arranged.

The following describes a case in which, as illustrated in FIG. 7, the reticle 33 is illuminated with optical beams L reflected on a plurality of facets 36a continuous with each other in a schematically circular ring shape. In this case, the linear polarization direction is only in the Y direction, which is determined in accordance with the linear polarization direction of the optical beam L when emitted from the FEL device 10.

To obtain such a shape of illumination light, preferable polarization illumination is known to be polarization illumination in a circumferential direction. Specifically, the linear polarization direction is set to be a direction along a schematic circumference to obtain the shape of illumination light in a schematically circular ring shape or a schematically circular shape. Thus, it is desirable that linear polarization directions as illustrated in FIG. 10 are set for the illumination light shape illustrated in FIG. 7. However, the configuration illustrated in FIG. 6 according to the comparative example has no function to individually set such linear polarization directions of optical beams incident on the PFM 36, and thus has difficulties in polarization direction control.

The following describes a case in which the reticle 33 is illuminated with illumination light having the bipolar shape of divisions on the right and left sides as illustrated in FIG. 8. This illumination light shape is achieved by setting, in the illumination light shape illustrated in FIG. 7, the angles of four facets 35a and the angles of four facets 36a as illustrated with four long arrows between the facets 36a in FIG. 8. In this case, too, the linear polarization direction is in the Y direction, which is determined in accordance with the linear polarization direction of the optical beam L when emitted from the FEL device 10, thereby achieving illumination in a desired circumferential direction at least.

The following describes another case in which the reticle 33 is illuminated with illumination light having the bipolar shape of divisions on the upper and lower sides as illustrated in FIG. 9. This illumination light shape is achieved by setting, in the illumination light shape illustrated in FIG. 7, the angles of four facets 35a and the angles of four facets 36a as illustrated with four long arrows between the facets 36a in FIG. 9. In this case, too, the linear polarization direction is in the Y direction, which is determined in accordance with the linear polarization direction of the optical beam L when emitted from the FEL device 10.

In a case of an illumination light shape as illustrated in FIG. 9, it is desirable to set all linear polarization directions to be in the X direction as illustrated in FIG. 11, depending on the pattern of the reticle 33, so that illumination is achieved in a desired circumferential direction. However, such setting of linear polarization directions is difficult to achieve with the configuration illustrated in FIG. 6 according to the comparative example.

3. Embodiment 1

3.1 Configuration of Embodiment 1

FIG. 12 is a partially broken side view schematically illustrating the configuration of a beam transmission system 121 and an EUV exposure device 130 according to Embodiment 1. The EUV exposure device 130 includes an illumination optical system according to the present invention. In the configuration illustrated in FIG. 12, any component identical to that illustrated in FIGS. 1 and 6 is denoted by an identical reference sign, and duplicate description thereof will be omitted.

The following describes, in the configuration according to Embodiment 1, any part different from the configuration illustrated in FIGS. 1 and 6. In Embodiment 1, any configuration other than the difference described below is basically same as the configuration illustrated in FIGS. 1 and 6.

The beam transmission system 121 according to the present embodiment transmits, to the EUV exposure device 130, an optical beam L emitted from the FEL device 10. The beam transmission system 121 includes the FEL device 10, the chamber 20, and a beam transmission control unit 61. The chamber 20 is provided with a first through-hole 123 and a second through-hole 223. A first collector mirror 124, a second collector mirror 224, an optical beam splitting unit 50, a first polarization direction rotating unit 51, and a second polarization direction rotating unit 52 are disposed in the chamber 20.

The optical beam splitting unit 50 splits, into a first optical beam L1 and a second optical beam L2, the optical beam L output from the FEL device 10 and incident in the chamber 20. A detailed configuration of the optical beam splitting unit 50 will be described later in detail.

The first polarization direction rotating unit 51 is disposed on the optical path of the first optical beam L1 to rotate the linear polarization direction of the first optical beam L1. The second polarization direction rotating unit 52 is disposed on the optical path of the second optical beam L2 to rotate the linear polarization direction of the second optical beam L2.

The first collector mirror 124 collects the first optical beam L1 having passed through the first polarization direction rotating unit 51. The first collector mirror 124 is disposed such that an IF (first IF) 125 of the collected first optical beam L1 substantially coincides with the first through-hole 123. The second collector mirror 224 collects the second optical beam L2 having passed through the second polarization direction rotating unit 52. The second collector mirror 224 is disposed such that an IF (second IF) 225 of the collected second optical beam L2 substantially coincides with the second through-hole 223.

The beam transmission control unit 61 controls operation of the first polarization direction rotating unit 51 and the second polarization direction rotating unit 52 based on information related to the reticle 33, which is transmitted from the exposure device control unit 60.

An FEL control unit 62 is provided to control operation of the FEL device 10. The FEL control unit 62 controls operation of the FEL device 10 based on a control signal transmitted from the exposure device control unit 60. When controlled in this manner, the FEL device 10 outputs an optical beam L that is pulse laser light at a predetermined timing.

The EUV exposure device 130 includes a first FFM 135 and a second FFM 235 in the illumination optical system 31 illustrated in FIG. 1. The first FFM 135 and the second FFM 235 each have a configuration basically same as that of the FFM 35 illustrated in FIGS. 1 and 6. The EUV exposure device 130 also includes a PFM 136 in the illumination optical system 31 illustrated in FIG. 1. The PFM 136 has a function same as that of the PFM 36 illustrated in FIGS. 1 and 6, but is not completely identical to the PFM 36 because the PFM 136 corresponds to the two FFMs. In FIG. 12, each facet (pupil facet) of the PFM 136 is denoted by 136a.

The exposure device control unit 60 controls the angles of the facets 35a (not illustrated in FIG. 12; Refer to FIG. 2) included in the first FFM 135 and the second FFM 235, and the angle of the facets 136a included in the PFM 136. This facet angle control is basically same as the control of the angles of the facets of the FFM 35 and the PFM 36 described with reference to FIG. 2.

The optical relation on imaging and the like among the first FFM 135, the PFM 136, and the reticle 33, and the optical relation on imaging and the like among the second FFM 235, the PFM 136, and the reticle 33 are basically same as the optical relation among the FFM 35, the PFM 36, and the reticle 33 described with reference to FIG. 2.

The following describes a specific configuration of the optical beam splitting unit 50 with reference to FIG. 13. In the present embodiment, the optical beam splitting unit 50 includes an oblique incidence high reflection mirror 50M. The oblique incidence high reflection mirror 50M is formed by using a substrate made of, for example, SiC or AlSi alloy. The oblique incidence high reflection mirror 50M is disposed obliquely relative to the traveling direction of the optical beam L output from the FEL device 10 so that only substantially half of the optical beam L, in other words, the lower half in FIG. 13 is reflected. Accordingly, the optical beam L is split into a reflected component as the first optical beam L1 and a non-reflected component as the second optical beam L2.

An incident angle θ of the optical beam L relative to the oblique incidence high reflection mirror 50M is preferably a value in the range of $80° \leq \theta < 90°$, more preferably a value in the range of $87° \leq \theta < 89.7°$.

The oblique incidence high reflection mirror SOM is likely to be heated to high temperature when irradiated with the optical beam L, and thus is desirably used while being cooled by flowing cooling water.

When the oblique incidence high reflection mirror 50M as described above is used, the first optical beam L1 and the second optical beam L2 after the splitting proceed while being angled relative to each other. However, FIG. 12 schematically illustrates a state in which the first optical beam L1 and the second optical beam L2 proceed in directions parallel to each other.

The following describes specific configurations of the polarization direction rotating units 51 and 52 with reference to FIGS. 14 to 16. The polarization direction rotating units 51 and 52 have configurations identical to each other, and thus the following description will be made on the polarization direction rotating unit through which the first optical beam L1 passes. FIGS. 14 and 15 illustrate a side view and a front view of the polarization direction rotating unit, respectively. FIG. 16 is a front view illustrating the polarization direction rotating unit in a state different from that illustrated in FIG. 15.

The polarization direction rotating unit includes a tilt stage 70 and a rotation member 74 rotatably held by the tilt stage 70. The rotation member 74 is shaped in a cylinder, part of which is removed, and is held rotatably about the axis of the cylinder by the tilt stage 70. A plate 75 is fixed to the rotation member 74, and a first mirror holder 76 and a second mirror holder 77 are fixed to the plate 75.

The first mirror holder 76 includes two surfaces tilted relative to a direction in which the first optical beam L1 proceeds. Among these tilted surfaces, the tilted surface on the back side in the traveling direction of the first optical beam L1 holds a first high reflection mirror 71, and the tilted surface on the front side in the traveling direction of the first optical beam L1 holds a third high reflection mirror 73. The second mirror holder 77 holds a second high reflection mirror 72 facing to the first high reflection mirror 71 and the third high reflection mirror 73. A motor 78 configured to rotate the rotation member 74 by a desired angle is attached to the tilt stage 70. Drive of the motor 78 is controlled by the beam transmission control unit 61 illustrated in FIG. 12.

The polarization direction rotating unit having the above-described configuration is disposed such that the first optical beam L1 proceeds on the rotation center of the rotation member 74 and is incident on the first high reflection mirror 71. The incident first optical beam L1 is sequentially reflected on the first high reflection mirror 71, the second high reflection mirror 72, and the third high reflection mirror 73.

3.2 Operation of Embodiment 1

In the configuration illustrated in FIG. 12, the FEL device 10 outputs an optical beam L that is pulse laser light. The optical beam L is linearly polarized by the undulator 11. The optical beam L is incident in the chamber 20 through the opening 22. The optical beam splitting unit 50 splits the optical beam L into a first optical beam L1 and a second optical beam L2. The first optical beam L1 is incident on the first polarization direction rotating unit 51. The second optical beam L2 is incident on the second polarization direction rotating unit 52.

For example, the first polarization direction rotating unit 51 transmits the first optical beam L1 without rotating the linear polarization direction of the incident first optical beam L1. The first optical beam L1 having passed through the first polarization direction rotating unit 51 are reflected on the first collector mirror 124. The reflected first optical beam L1 is emitted out of the chamber 20 through the first through-hole 123, collected at the first IF 125, and then incident in the EUV exposure device 130.

For example, the second polarization direction rotating unit 52 rotates the linear polarization direction of the incident second optical beam L2 by 90° and transmits the second optical beam L2. The second optical beam L2 having passed through the second polarization direction rotating unit 52 is reflected on the second collector mirror 224. The reflected second optical beam L2 is emitted out of the chamber 20 through the second through-hole 223, collected at the second IF 225, and then incident in the EUV exposure device 130.

In FIG. 12, the linear polarization directions of the first optical beam L1 and the second optical beam L2, which are parallel to the sheet of FIG. 12 are illustrated with Arrows P. The linear polarization directions thereof perpendicular to the sheet of FIG. 12 are illustrated with Points Q. As illustrated in FIG. 12, the linear polarization direction of the second optical beam L2 having passed through the second polarization direction rotating unit 52 is rotated by 90° relative to the linear polarization direction of the first optical beam L1 having passed through the first polarization direction rotating unit 51.

The following describes the rotation of the second optical beam L2 in detail. A rotation angle φ of the rotation member 74 relative to the tilt stage 70 illustrated in FIGS. 15 and 16 is defined to be 0° in the state illustrated in FIG. 15. In the state illustrated in FIG. 15, the linear polarization direction of the first optical beam L1 before being incident on the first high reflection mirror 71 is maintained intact after reflection on the third high reflection mirror 73. In other words, the linear polarization direction of the optical beam L1 is not rotated when the rotation angle φ is 0°.

When the rotation member 74 is rotated by the rotation angle φ=45°, the state illustrated in FIG. 16 is obtained. In this case, the linear polarization direction of the first optical beam L1 reflected on the third high reflection mirror 73 is rotated by 90° relative to the linear polarization direction of the first optical beam L1 before being incident on the first high reflection mirror 71.

The first optical beam L1 incident in the EUV exposure device 130 is sequentially reflected on the first FFM 135 and the PFM 136 and then incident on the reticle 33. Refer to FIG. 1 since the reticle 33 is not illustrated in FIG. 12. The second optical beam L2 incident in the EUV exposure device 130 is sequentially reflected on the second FFM 235 and the PFM 136 and then incident on the reticle 33.

The first FFM 135, the second FFM 235, the PFM 136, and the reticle 33 have such an optical position relation that the relation of the linear polarization direction between the first optical beam L1 incident on the first FFM 135 and the second optical beam L2 incident on the second FFM 235 is maintained intact on the reticle 33.

As described above, the shapes of the optical beams L1 and L2 incident on the reticle 33 are controlled by controlling the angles of the facets of the first FFM 135, the second FFM 235, and the PFM 136 for each reticle 33.

As described above, an image of the reticle 33 is transferred and formed onto a photoresist on the wafer 34 by the optical beams L1 and L2 reflected on the reticle 33, and the entire surface image of the reticle 33 is transferred and formed onto the photoresist by scanning the reticle 33 and the wafer 34.

In the above-described example, the linear polarization direction of the first optical beam L1 is not rotated at the first polarization direction rotating unit 51, the linear polarization direction of the second optical beam L2 is rotated by 90° at the second polarization direction rotating unit 52. However, the rotation control of the linear polarization direction is not limited thereto. For example, both of the linear polarization directions of the first optical beam L1 and the second optical beam L2 may be rotated by 90°, or none of the linear polarization directions of the first optical beam L1 and the second optical beam L2 may be rotated. In addition, the angle by which each linear polarization direction is rotated may be any angle other than 90°.

Such rotation control of the linear polarization direction is performed by the beam transmission control unit 61 controlling operation of the first polarization direction rotating unit 51 and the second polarization direction rotating unit 52 based on an instruction output from the exposure device control unit 60 for each sequentially replaced reticle 33.

When the linear polarization direction of one of the first optical beam L1 and the second optical beam L2 is rotated by 90°, the two linear polarization directions on the reticle 33 are different from each other by 90°. The two linear polarization directions on the reticle 33 can be set to be different from each other by any angle other than 90° by rotating the linear polarization direction of one of the first optical beam L1 and the second optical beam L2 by any angle other than 90°. However, the pattern of the reticle 33 typically includes a longitudinal line and a transverse line orthogonal to each other. Thus, in most cases of setting the two linear polarization directions on the reticle 33, the two linear polarization directions need to be set to have an angle of 90° relative to each other. For this reason, when the polarization angle between the first optical beam L1 and the second optical beam L2 on the reticle 33 can be set to only one value in addition to 0°, which corresponds to an identical direction, the angle is preferably set to be 90°.

3.3 Effects of Embodiment 1

As described above, since the optical beam splitting unit 50, the first polarization direction rotating unit 51, and the second polarization direction rotating unit 52 are provided in the present embodiment, one or both of the polarization directions of the first optical beam L1 and the second optical beam L2 can be freely changed. Accordingly, the two linear polarization directions on the reticle 33 can be freely set.

The shape of illumination light incident on the reticle 33 can be freely set by controlling the angles of the facets of each of the first FFM 135, the second FFM 235, and the PFM 136.

With the above-described configuration, for example, the shape and linear polarization pattern of illumination light can be set as illustrated in FIG. 10 in the present embodiment. When the shape of illumination light is set as illustrated in FIGS. 9 and 11, the linear polarization pattern of illumination light can be set as illustrated in FIG. 9, or can be set as illustrated in FIG. 11, which is, however, not optimum. Thus, according to the present embodiment, the resolving power of the exposure device can be improved.

4. Embodiment 2

4.1 Configuration of Embodiment 2

FIG. 17 is a partially broken side view schematically illustrating the configuration of a beam transmission system 221 and the EUV exposure device 130 according to Embodiment 2. In the configuration illustrated in FIG. 17, any component identical to that illustrated in FIG. 12 is denoted by an identical reference sign, and duplicate description thereof will be omitted.

The beam transmission system 221 according to Embodiment 2 has a configuration different from that of the beam transmission system 121 according to Embodiment 1. Specifically, the beam transmission system 221 includes an optical pulse stretcher 80 disposed on the optical path of the optical beam L between the FEL device 10 and the optical beam splitting unit 50. FIG. 18 illustrates a detailed configuration of the optical pulse stretcher 80. As illustrated in FIG. 18, the optical pulse stretcher 80 includes a reflective first grating 85 and a reflective second grating 86. The first grating 85 and the second grating 86 have groove pitches substantially equal to each other.

The first grating 85 is disposed at a position at which the optical beam L is incident so that the optical beam L has an incident angle α and a diffraction angle β. The second grating 86 is disposed at a position at which the optical beam L reflected and diffracted on the first grating 85 is incident so that the incident angle of the optical beam L is substantially equal to β and the diffraction angle thereof is substantially equal to α. The incident and diffraction angles are obtained for the central wavelength of the optical beam L.

4.2 Operation of Embodiment 2

An optical beam L that is pulse laser light output from the FEL device 10 has a short pulse width of, for example, 0.1 to 0.2 ps (picosecond), and thus has a wide spectrum line width according to the uncertainty principle, thereby having extremely high energy per unit time. When the optical beam L is reflected and diffracted on the gratings 85 and 86, the optical path of a long wavelength component of the optical beam L is shorter whereas the optical path of a short wavelength component of the optical beam L is longer because the diffraction angle differs between the long and short wavelength components. Accordingly, the pulse width of the optical beam L is stretched in accordance with the spectrum line width.

4.3 Effects of Embodiment 2

When the pulse width of the beam L is stretched as described above, the energy of the optical beam L, which is pulse laser light, per unit time decreases. This leads to prevention of damage, due to ablation by the optical beam L, on a film used on the reflection surface of an optical element at a stage later than the optical pulse stretcher 80, and a resist on the wafer. Examples of the optical element include the polarization direction rotating units 51 and 52, the collector mirrors 124 and 224, and various optical elements in the EUV exposure device 130.

5. Embodiment 3

5.1 Configuration of Embodiment 3

FIG. 19 is a partially broken side view schematically illustrating the configuration of a beam transmission system 321 and the EUV exposure device 130 according to Embodiment 3. In the configuration illustrated in FIG. 19, any component identical to that illustrated in FIG. 12 is denoted by an identical reference sign, and duplicate description thereof will be omitted.

The beam transmission system 321 according to Embodiment 3 has a configuration different from that of the beam transmission system 121 according to Embodiment 1. Specifically, the beam transmission system 321 includes a polarization direction rotating unit 52 only on the optical path of the second optical beam L2 among the first optical beam L1 and the second optical beam L2 split by the optical beam splitting unit 50. The polarization direction rotating unit 52 may be same as the second polarization direction rotating unit 52 used in the configuration illustrated in FIG. 12.

The beam transmission system 321 according to the present embodiment includes a first optical pulse stretcher 81 and a second optical pulse stretcher 82 disposed on the respective optical paths of the first optical beam L1 and the second optical beam L2 split by the optical beam splitting unit 50. The optical pulse stretchers 81 and 82 may be same as the optical pulse stretcher 80 illustrated in FIG. 18.

The beam transmission system 321 according to the present embodiment includes an optical beam splitting unit 90 having a configuration different from that of the optical beam splitting unit 50 illustrated in FIGS. 12 and 17. The optical beam splitting unit 90 has a function to select the optical path of the optical beam L, in particular. The following describes the optical beam splitting unit 90 in detail with reference to FIGS. 20 and 21.

The optical beam splitting unit 90 includes a movable oblique incidence high reflection mirror 90M. The movable oblique incidence high reflection mirror 90M has a mirror configuration equivalent to that of the oblique incidence high reflection mirror 50M illustrated in FIG. 13. In addition, the optical beam splitting unit 90 includes an actuator (not illustrated) configured to change the position of the movable oblique incidence high reflection mirror 90M.

The movable oblique incidence high reflection mirror 90M is driven by the actuator and set to any one of a first state illustrated with solid lines in FIG. 20, a second state illustrated with dashed lines in FIG. 20, and a third state illustrated in FIG. 21. In the first state, the optical beam L is fully reflected on the movable oblique incidence high reflection mirror 90M disposed such that the entire optical beam L is incident on the movable oblique incidence high reflection mirror 90M. In the second state, the movable oblique incidence high reflection mirror 90M is retracted from the optical path of the optical beam L. In the third state, the optical beam L is partially reflected on the movable oblique incidence high reflection mirror 90M disposed such that part of the optical beam L is incident on the movable oblique incidence high reflection mirror 90M. Drive of the actuator may be manually controlled through a switch or automatically controlled by the beam transmission control unit 61.

5.2 Operation of Embodiment 3

When the movable oblique incidence high reflection mirror 90M is set to the first state, the optical beam L is all reflected and proceeds on the optical path of the first optical beam L1. When the movable oblique incidence high reflection mirror 90M is set to the second state, the optical beam L all proceeds on the optical path of the second optical beam L2 without being reflected on the movable oblique incidence high reflection mirror 90M. When the movable oblique incidence high reflection mirror 90M is set to the third state, the optical beam L is split into the first optical beam L1 and the second optical beam L2. In this case, too, the first optical beam L1 proceeds on the optical path of the first optical beam, and the second optical beam L2 proceeds on the optical path of the second optical beam.

5.3 Effects of Embodiment 3

Since the beam transmission system 321 according to Embodiment 3 includes the single polarization direction rotating unit 52, device simplification is achieved as compared to a configuration provided with two polarization direction rotating units.

According to Embodiment 3, it is difficult to individually and optionally change the linear polarization directions of the first optical beam L1 and the second optical beam L2. However, as described above, the pattern of the reticle 33 typically includes a longitudinal line and a transverse line orthogonal to each other. With this configuration, no problem occurs to setting of the linear polarization directions, for example, when the fixed linear polarization direction of the first optical beam L1 is set to be parallel to a direction in which the longitudinal line or the transverse line extends on the reticle 33. Specifically, the linear polarization direction of the first optical beam L1 can be set in this manner when set parallel or right-angled to a side of the reticle 33. This is because the longitudinal line or the transverse line of the pattern of the reticle 33 typically extends in parallel to a side of the reticle 33.

The linear polarization direction of the second optical beam L2 rotated by the polarization direction rotating unit 52 may be set parallel or orthogonal to the fixed linear polarization direction of the first optical beam L1 on the reticle 33.

The optical path selection function of the optical beam splitting unit 90 enables selective setting of a state in which only one of the first optical beam L1 and the second optical beam L2 is transmitted to the EUV exposure device 130 and a state in which both of the optical beams L1 and L2 are transmitted to the EUV exposure device 130.

6. Embodiment 4

6.1 Configuration of Embodiment 4

FIG. 22 is a partially broken side view schematically illustrating the configuration of a beam transmission system 421 and the EUV exposure device 130 according to Embodiment 4. In the configuration illustrated in FIG. 22, any component identical to that illustrated in FIG. 12 is denoted by an identical reference sign, and duplicate description thereof will be omitted.

The beam transmission system 421 according to Embodiment 4 has a configuration different from that of the beam transmission system 121 according to Embodiment 1. Specifically, the beam transmission system 421 does not include the optical beam splitting unit 50.

In Embodiment 4, two FEL devices of a first FEL device 110 and a second FEL device 210 are provided. The first FEL device 110 outputs a first optical beam L1 that is pulse laser light. The second FEL device 210 outputs a second optical beam L2 that is pulse laser light. The second FEL device 210 is disposed such that the second optical beam L2 output from the second FEL device 210 proceeds in parallel to the first optical beam L1 output from the first FEL device 110.

The first polarization direction rotating unit 51 configured to rotate the linear polarization direction of the first optical beam L1 is disposed on the optical path of the first optical beam L1. The second polarization direction rotating unit 52 configured to rotate the linear polarization direction of the second optical beam L2 is disposed on the optical path of the second optical beam L2.

In this configuration in which the first FEL device 110 and the second FEL device 210 are provided, too, only one of the linear polarization directions of the first optical beam L1 and the second optical beam L2 may be rotated as in the configuration illustrated in FIG. 19.

6.2 Operation of Embodiment 4

The linear polarization directions of the first optical beam L1 and the second optical beam L2 are rotated by the first polarization direction rotating unit 51 and the second polarization direction rotating unit 52, respectively. The first optical beam L1 and the second optical beam L2 are used in the same manner as in the configuration illustrated in FIG. 12.

6.3 Effects of Embodiment 4

In the present embodiment, the two FEL devices 110 and 210 are provided, which eliminates the need to provide an optical beam splitting unit.

7. Embodiment 5

7.1 Configuration of Embodiment 5

FIG. 23 is a partially broken side view schematically illustrating the configuration of a beam transmission system 521 and the EUV exposure device 130 according to Embodiment 5. In the configuration illustrated in FIG. 23, any component identical to that illustrated in FIG. 22 is denoted by an identical reference sign, and duplicate description thereof will be omitted.

The beam transmission system 521 according to Embodiment 5 has a configuration different from that of the beam transmission system 421 according to Embodiment 4. Specifically, the beam transmission system 521 has the configuration of the beam transmission system 421 except for the first polarization direction rotating unit 51 and the second polarization direction rotating unit 52.

7.2 Operation of Embodiment 5

The linear polarization direction of the first optical beam L1 is set to be in a desired direction on the reticle 33 by controlling the undulator 11 of the first FEL device 110. The linear polarization direction of the second optical beam L2 is set to be in a desired direction on the reticle 33 by controlling the undulator 11 of the second FEL device 210.

7.3 Effects of Embodiment 5

The two FEL devices 110 and 210 are provided in the present embodiment, which eliminates the need to provide an optical beam splitting unit. In addition, one or two polarization direction rotating units do not need to be provided.

8. Modification 1 of Optical Beam Splitting Unit

8.1 Configuration of Modification 1 of Optical Beam Splitting Unit

FIG. 24 is a partially broken side view illustrating an optical beam splitting unit according to Modification 1, which is included in a beam transmission system according to the present invention. The optical beam splitting unit according to Modification 1 includes a wedge-shaped oblique incidence high reflection mirror 120. Two reflection surfaces divided at a leading end of the wedge-shaped oblique incidence high reflection mirror 120, which are upper and lower reflection surfaces in FIG. 24, are each coated with a metal film made of, for example, Au or Ru. The wedge-shaped oblique incidence high reflection mirror 120 is disposed such that an optical beam L is first incident on the sharp leading end side on the optical path of the optical beam L.

8.2 Operation of Modification 1 of Optical Beam Splitting Unit

The optical beam L first incident on the leading end side of the wedge-shaped oblique incidence high reflection mirror 120 is reflected on the upper and lower reflection surfaces of the wedge-shaped oblique incidence high reflection mirror 120. The optical beams L thus reflected in two split directions proceeds as the first optical beam L1 and the second optical beam L2, respectively.

8.3 Effects of Modification 1 of Optical Beam Splitting Unit

The configuration of the optical beam splitting unit is simplified by providing the wedge-shaped oblique incidence high reflection mirror 120.

9. Modification 2 of Optical Beam Splitting Unit

9.1 Configuration of Modification 2 of Optical Beam Splitting Unit

FIGS. 25 and 26 are a side view and a top view, respectively, illustrating an optical beam splitting unit according to Modification 2, which is included in a beam transmission system according to the present invention.

The optical beam splitting unit according to Modification 2 includes a grating 140. The grating 140 includes a plurality of diffraction gratings fabricated to have grooves at a predetermined grating pitch and each having, for example, a rectangular section. These diffraction gratings are formed in such a groove depth that generation of the zeroth light of the optical beam L is prevented but the (+1)-th diffracted light and the (−1)-th diffracted light are both enhanced. The grating 140 has diffraction surface coated with a multi-layered film made of Mo and Si or a metal film made of, for example, Au or Ru. The grating 140 is disposed on the optical path of the optical beam L such that the optical beam L is incident on the diffraction surface.

9.2 Operation of Modification 2 of Optical Beam Splitting Unit

The optical beam L incident on the diffraction surface of the grating 140 is diffracted on the diffraction surface and split into the (+1)-th light and the (−1)-th light. The split optical beams L proceed as the first optical beam L1 and the second optical beam L2, respectively.

10. Modification 1 of Polarization Direction Rotating Unit

10.1 Configuration of Modification 1 of Polarization Direction Rotating Unit FIG. 27 is a schematic perspective view illustrating a polarization direction rotating unit according to Modification 1, which is included in a beam transmission system according to the present invention. FIG. 28 is a schematic perspective view illustrating Modification 1 in another state. States of the polarization direction rotating unit illustrated in FIGS. 27 and 28 are referred to as a first state and a second state, respectively. In FIGS. 27 and 28, the first optical beam L1 is incident on the polarization direction rotating unit.

The polarization direction rotating unit according to Modification 1 includes a first high reflection mirror 201, a second high reflection mirror 202, a third high reflection mirror 203, a fourth high reflection mirror 204, and a fifth high reflection mirror 205. The polarization direction rotating unit also includes a first linear stage 301 on which the first high reflection mirror 201 is mounted and that changes the position of the first high reflection mirror 201, and a second linear stage 302 on which the fifth high reflection mirror 205 is mounted and that changes the position of the fifth high reflection mirror 205. The first linear stage 301 and the second linear stage 302 are included in mirror moving means in the present disclosure. The beam transmission control unit 61 controls operation of the first linear stage 301 and the second linear stage 302.

The first high reflection mirror 201 is disposed to reflect the first optical beam L1 in the V direction. The second high reflection mirror 202 is disposed to reflect the first optical beam L1 in the H direction. The third high reflection mirror 203 is disposed to reflect the first optical beam L1 in the Z direction. The V direction, the H direction, and the Z direction correspond to a first reflection direction, a second reflection direction, and a third reflection direction in the present disclosure.

10.2 Operation of Modification 1 of Polarization Direction Rotating Unit

In the first state of the polarization direction rotating unit illustrated in FIG. 27, the first optical beam L1 is sequentially reflected on the first high reflection mirror 201, the second high reflection mirror 202, and the third high reflection mirror 203. Specifically, in this state, the first linear stage 301 is located at a first position, and accordingly, the first high reflection mirror 201 is inserted into the optical path of the first optical beam L1. The second linear stage 302 is located at a first position, and accordingly, the fifth high reflection mirror 205 is removed from the optical path of the first optical beam L1. In this state, the first optical beam L1 is reflected on the second high reflection mirror 202, and accordingly, the linear polarization direction of the first optical beam L1 is rotated by 90°.

In the second state of the polarization direction rotating unit illustrated in FIG. 28, the first optical beam L1 is sequentially reflected on the fourth high reflection mirror 204 and the fifth high reflection mirror 205. Specifically, in this state, the first linear stage 301 is located at a second position, and accordingly, the first high reflection mirror 201 is removed from the optical path of the first optical beam L1. The second linear stage 302 is located at a second position, and accordingly, the fifth high reflection mirror 205 is inserted into the optical path of the first optical beam L1. In this state, the linear polarization direction of the first optical beam L1 is not rotated.

10.3 Effects of Modification 1 of Polarization Direction Rotating Unit

The above-described configuration enables selective setting of the state in which the linear polarization direction of the first optical beam L1 is not rotated and the state in which the linear polarization direction of the first optical beam L1 is rotated by 90°.

The above description is not intended to provide limitation but is merely exemplary. Thus, the embodiments of the present disclosure can be modified without departing from the scope of the accompanying claims, which is to be clearly understood by the skilled person in the art.

Any term used in the present specification and the accompanying claims should be understood as a "non-restrictive" term. For example, the term "include" or "included" should be understood as "the present invention is not limited to a component described as being included". The term "have" should be understood as "the present invention is not limited to a component described as being had". When used in the present specification and the accompanying claims, the indefinite article "a" should be understood as "at least one" or "one or more".

REFERENCE SIGNS LIST

10 FEL device
11 Undulator
20 Chamber
21, 121, 221, 321, 421, 521 Beam transmission system
22 Opening
23 Through-hole
24 Collector mirror
25 Intermediate Focus (IF)
30 EUV exposure device
31 Illumination optical system
32 Projection optical system
33 Reticle
34 Wafer
35 FFM: Field Facet Mirror
35a Field facet
36 PFM: Pupil Facet Mirror
36a Pupil facet
37 Concave mirror
38 Concave mirror
39 Housing
50 Optical beam splitting unit
50M Oblique incidence high reflection mirror
51 First polarization direction rotating unit
52 Second polarization direction rotating unit
60 Exposure device control unit
61 Beam transmission control unit
62 FEL control unit
70 Tilt stage
71 First high reflection mirror
73 Third high reflection mirror
72 Second high reflection mirror
74 Rotation member
75 Plate
76 First mirror holder
77 Second mirror holder
78 Motor
80 Optical pulse stretcher
85 First grating
86 Second grating
90 Polarization direction rotating unit
90M Movable oblique incidence high reflection mirror
120 Wedge-shaped oblique incidence high reflection mirror
110 First FEL device
123 First through-hole
124 First collector mirror
125 First IF
130 EUV exposure device
135 First FFM
136 PFM
136a Pupil facet
140 Grating
201 First high reflection mirror
202 Second high reflection mirror
203 Third high reflection mirror
204 Fourth high reflection mirror
205 Fifth high reflection mirror
210 Second FEL device
223 Second through-hole
224 Second collector mirror
225 Second IF
235 Second FFM
301 First linear stage
302 Second linear stage
L Optical beam
Ls Sectional shape of optical beam
L1 First optical beam
L2 Second optical beam
74 Incident angle
100 Rotation angle

What is claimed is:

1. A beam transmission system that transmits, to an exposure device, a linearly polarized optical beam output from a free electron laser device, the beam transmission system comprising:
an optical beam splitting unit configured to split the optical beam into a first optical beam and a second optical beam, the first optical beam and the second optical beam being polarized in a first direction; and
a first polarization direction rotating unit configured to rotate a linear polarization direction of the first optical beam to a second direction different from the first direction,
wherein the first polarization direction rotating unit rotates a linear polarization direction of the optical beam by reflecting the optical beam a plurality of times, and
wherein the first polarization direction rotating unit includes:
a first reflection mirror configured to reflect the optical beam;
a second reflection mirror configured to reflect the optical beam reflected on the first reflection mirror;
a third reflection mirror configured to reflect the optical beam reflected on the second reflection mirror; and
a rotation member configured to hold each of the first reflection mirror, the second reflection mirror, and the third reflection mirror and rotate about a rotation axis, the rotation member being disposed such that the optical beam before being incident on the first reflection mirror travels along the rotation axis.

2. The beam transmission system according to claim 1, further comprising a second polarization direction rotating unit configured to rotate a linear polarization direction of the second optical beam.

3. The beam transmission system according to claim 1, wherein the optical beam splitting unit includes an oblique incidence reflection mirror disposed such that the optical beam is obliquely incident and partially reflected on the oblique incidence reflection mirror.

4. The beam transmission system according to claim 1, wherein the optical beam splitting unit includes a movable oblique incidence reflection mirror that can be disposed at different positions and selectively has one of a first state in which the optical beam is fully obliquely incident and fully reflected on the movable oblique incidence reflection mirror, a second state in which the movable oblique incidence reflection mirror is retracted from an optical path of the optical beam, and a third state in which the optical beam is partially obliquely incident and partially reflected on the movable oblique incidence reflection mirror.

5. The beam transmission system according to claim 1, wherein the optical beam splitting unit includes a wedge-shaped oblique incidence reflection mirror formed in a wedge shape, having two reflection surfaces separated at a wedge-shaped leading end, and disposed such that the optical beam is reflected on the two reflection surfaces.

6. The beam transmission system according to claim 1, wherein the optical beam splitting unit includes a grating having a diffraction surface on which the incident optical beam is diffracted as (+1)-th diffracted light that is the first optical beam and as (−1)-th diffracted light that is the second optical beam.

7. The beam transmission system according to claim 1, wherein the first polarization direction rotating unit rotates the linear polarization direction of the first optical beam such that the linear polarization direction of the first optical beam is angled at 90° relative to the linear polarization direction of the second optical beam on an illumination surface of the exposure device.

8. The beam transmission system according to claim 1, further comprising an optical pulse stretcher disposed on an optical path of at least one of the optical beam, the first optical beam, and the second optical beam.

9. An illumination optical system that illuminates the illumination surface of the exposure device with the optical beam transmitted by the beam transmission system according to claim 1, the illumination optical system comprising:
   a first field facet mirror irradiated with the first optical beam;
   a second field facet mirror irradiated with the second optical beam; and
   a pupil facet mirror irradiated with the first optical beam via the first field facet mirror and the second optical beam via the second field facet mirror.

10. The illumination optical system according to claim 9, wherein the linear polarization direction of the first optical beam via the first field facet mirror and the pupil facet mirror on the illumination surface is orthogonal to the linear polarization direction of the second optical beam via the second field facet mirror and the pupil facet mirror on the illumination surface.

11. The illumination optical system according to claim 9, wherein the linear polarization direction of the first optical beam via the first field facet mirror and the pupil facet mirror on the illumination surface is parallel to the linear polarization direction of the second optical beam via the second field facet mirror and the pupil facet mirror on the illumination surface.

12. The illumination optical system according to claim 9, wherein the illumination surface is illuminated with both of the first optical beam via the first field facet mirror and the pupil facet mirror and the second optical beam via the second field facet mirror and the pupil facet mirror.

13. The illumination optical system according to claim 9, wherein the illumination surface is illuminated with one of the first optical beam via the first field facet mirror and the pupil facet mirror and the second optical beam via the second field facet mirror and the pupil facet mirror.

14. The illumination optical system according to claim 9, wherein a reticle as the illumination surface is illuminated.

* * * * *